(12) United States Patent
Koyama et al.

(10) Patent No.: US 7,485,936 B2
(45) Date of Patent: Feb. 3, 2009

(54) SEMICONDUCTOR DEVICE AND METHOD OF MANUFACTURING THE SAME

(75) Inventors: Masato Koyama, Kanagawa-Ken (JP); Yoshinori Tsuchiya, Yokohama (JP); Reika Ichihara, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/355,132

(22) Filed: Feb. 16, 2006

(65) Prior Publication Data

US 2007/0001238 A1    Jan. 4, 2007

(30) Foreign Application Priority Data

Jun. 29, 2005    (JP)    ............... 2005-190018

(51) Int. Cl.
*H01L 29/76*    (2006.01)
(52) U.S. Cl. ................... 257/407; 257/E29.16
(58) Field of Classification Search ........... 257/407, 257/E27.112, 391, 392, 486, 763, 764, E21.637, 257/E29.16, E29.158
See application file for complete search history.

(56) References Cited

U.S. PATENT DOCUMENTS

| | | | | |
|---|---|---|---|---|
| 5,795,808 | A * | 8/1998 | Park | ............... 438/301 |
| 6,376,888 | B1 * | 4/2002 | Tsunashima et al. | ........ 257/407 |
| 2003/0011035 | A1 * | 1/2003 | Komatsu | ............... 257/407 |
| 2004/0043569 | A1 * | 3/2004 | Ahn et al. | ............... 438/287 |
| 2004/0248362 | A1 * | 12/2004 | Nakamura et al. | ........ 438/241 |
| 2005/0110098 | A1 * | 5/2005 | Yoshihara | ............... 257/371 |
| 2006/0151846 | A1 * | 7/2006 | Callegari et al. | ............ 257/411 |

FOREIGN PATENT DOCUMENTS

JP    2003-273350    9/2003

OTHER PUBLICATIONS

Lin et al., "An Adjustable Work Function Technology Using Mo Gate for CMOS Devices", IEEE Electron Device Letters, vol. 23, No. 1, pp. 49-51, (2002).
Aoyama et al., "Process Integration Issues on Mo-Metal-Gated MOSFETs with HfO₂ High-k Gate Dielectrics", Japanese Journal of Applied Physics, vol. 44, No. 4B, pp. 2283-2287, (2005).

* cited by examiner

*Primary Examiner*—David Vu
(74) *Attorney, Agent, or Firm*—Finnegan, Henderson, Farabow, Garrett & Dunner, L.L.P.

(57) ABSTRACT

It is possible to provide a semiconductor device including a CMOS device having a gate electrode, in which the variation in threshold voltage is little. There are a p-channel MIS transistor and a n-channel MIS transistor which are provided in a semiconductor substrate, and in a region of a gate electrode of the p-channel MIS transistor at least 1 nm or less apart from the interface with a gate insulating film, the oxygen concentration is $10^{20}$ cm$^{-3}$ or more and $10^{22}$ cm$^{-3}$ or less.

15 Claims, 13 Drawing Sheets

$\phi m, eff = \phi m + V_{dipole}$ $\phi m, eff = \phi m$

| CATION CONSTITUTING GATE ELECTRODE | ELECTRONEGATIVITY OF CATION |
|---|---|
| Ta | 1.5 |
| Nb | 1.6 |
| V | 1.6 |
| Ti | 1.5 |
| Zr | 1.4 |
| Hf | 1.3 |
| Y | 1.2 |
| La | 1.1 |

FIG. 5A

| GATE INSULATING FILM | CONSTITUENT CATION ELEMENT | ELECTRONEGATIVITY OF CATION |
|---|---|---|
| $SiO_2$(SiON) | Si | 1.8 |
| HfSiON(Hf30%) | Hf, Si | 1.61 |

FIG. 5B

| GATE ELECTRODE | WORK FUNCTION [eV] |
|---|---|
| Ta | 4.25 |
| Nb | 4.3 |
| V | 4.3 |
| $TaSi_x$ | 4.4 |
| $TaSi_xN_y$ | 4.4 |
| $HfSi_x$ | 4.3 |
| $HfSi_xN_y$ | 4.3 |
| $YSi_x$ | 3.8 |
| $ErSi_x$ | 3.8 |
| $LaB_x$ | 4 |

FIG. 6

SEMICONDUCTOR DEVICE AND METHOD OF MANUFACTURING THE SAME

CROSS-REFERENCE TO RELATED APPLICATION

This application is based upon and claims the benefit of priority from prior Japanese Patent Application No. 2005-190018, filed on Jun. 29, 2005, the entire contents of which are incorporated herein by reference.

BACKGROUND OF THE INVENTION

1. Field of the Invention

The present invention relates to a semiconductor device and a method of manufacturing the same.

2. Background Art

When a next-generation CMOS (complementary metal oxide semiconductor) device, which may have a gate length on the order of submicrons, is manufactured, it is highly possible that the gate electrodes of MIS transistors constituting the device cannot be formed of silicon, the material used in previous generation devices.

One reason for this is the sheet resistance of silicon, which is as high as a few tens $\Omega$/square. When silicon is used to form a gate electrode, a so-called RC delay cannot be ignored when the device is operated. Generally, the sheet resistance of a gate electrode having a gate length of a submicron size for which the RC delay can be ignored is considered to be 5 $\Omega$/square or less.

Another reason is the depletion in the gate electrode. Since the solubility limit of an impurity (dopant) with respect to silicon is about $1 \times 10^{20}$ cm$^{-3}$, when a gate electrode is formed of silicon, a depletion layer having a limited length extends in the gate electrode, which causes the deterioration of the current drivability of the MIS transistor.

Specifically, the depletion layer functions as a capacitance between the gate electrode and a channel region, the capacitance being connected in series to a gate insulating film. Accordingly, the gate capacitance of the MIS transistor substantially corresponds to the sum of the capacitance of the gate insulating film and the capacitance of the depletion layer. When recalculated as, for example, the thickness of silicon oxide constituting the gate insulating film, the capacitance of the depletion layer corresponds to a silicon oxide layer having a thickness of about 0.3 nm-0.5 nm. This causes a problem in that the current drivability of transistor elements is decreased.

Since the standard gate length of an MIS transistor will become on the order of submicrons in the future, the thickness of a gate insulating film thereof is expected to become 1.5 nm or less when calculated as a silicon oxide. This would make the capacitance caused by the depletion layer 20% or more of the capacitance of the gate insulating film. Such a high ratio cannot be ignored.

One way to solve the aforementioned problem is to add a high-concentration impurity (phosphorous, boron, etc.) to the silicon gate electrode to decrease the specific resistance thereof. However, as already mentioned, in an MIS transistor having a gate length of submicron size, the thickness of the gate insulating film is 1.5 nm or less. In such a case, a problem arises in that the impurity in the gate electrode passes through the gate insulating film, and diffuses into or penetrates the silicon substrate.

Such diffusion or penetration of an impurity may cause a decrease in current drivability of MIS transistor or a variation in threshold voltage.

In an attempt to solve this problem, recently, a high melting point metal such as molybdenum, tungsten, tantalum, etc. or a nitride thereof is used to form a gate electrode. This is referred to as a metal gate technique.

According to the metal gate technique, a gate electrode is formed of a metal having a specific resistance smaller than that of silicon. Therefore, basically the RC delay thereof can be ignored. Furthermore, in principle, no depletion layer is generated in a metal. Accordingly, no decrease in current drivability of an MIS transistor, as in the case of a silicon gate, is caused by the depletion layer when a metal is used. Moreover, since it is not necessary to add an impurity to a metal gate in order to decrease the resistance, no decrease in current drivability or variation in the threshold voltage in a MIS transistor is caused by diffusion or penetration of an impurity.

However, the metal gate technique is not perfect. When a CMOS device is formed using the metal gate technique, the following specific problem arises.

In the metal gate technique, a metal material having a work function close to that of p$^+$ silicon should be used to form the gate electrode of a p-channel MIS transistor, and a metal material having a work function close to that of n$^+$ silicon should be used to form the gate electrode of an n-channel MIS transistor. In this manner, it is possible to set the threshold voltage of the p-channel MIS transistor and the n-channel MIS transistor at appropriate values.

This is the so-called dual $\phi$ (phi) metal gate technique. Actually, however, it is difficult to find a metal material having a work function similar to that of p$^+$ silicon or n$^+$ silicon and having a heat-resistant property. Accordingly, no optimum material meeting the aforementioned conditions to form a gate insulating film or a gate electrode has been found as of today.

If a heat-resistant metal material having an appropriate work function suitable for forming a gate insulating film and a gate electrode were found, such a metal material would not be useful if such a metal material could not be used to form a gate insulating film and a gate electrode by an LSI manufacturing process. For example, in a silicon gate electrode formed by a conventional self-aligning process, a p-channel MIS transistor and an n-channel MIS transistor are simultaneously processed and formed, thereby simplifying the steps of the process. However, since different metal materials are used to form a p-channel MIS transistor and an n-channel MIS transistor in the dual $\phi$ metal gate technique, it is not possible to perform simultaneous processing. Accordingly, an increase in the number of steps in the process becomes a problem. At the same time, there is a problem in that optimum processing conditions should be considered for each material.

There is a technique in that work function is changed by implanting impurity atoms such as nitrogen atoms (R. Lin et al., "An Adjustable Work Function Technology Using Mo Gate for CMOS Devices", IEEE Electron Device Letters, vol. 23, pp.49-51 (2004) (Reference 1), and T. Aoyama and Y. Nara, "Process Integration Issues on Mo-Metal-Gated MOSFETs with HfO$_2$ High-k Gate Dielectrics", Jap. J. Appl. Phys., vol.44, pp. 2,283-2,287 (2005) (Reference 2)) or oxygen or fluorine atoms (Japanese Patent Laid-Open Publication No. 2003-273350 (Reference 3)) into either of the gate electrode of an n-channel MIS transistor or the gate electrode of a p-channel MIS transistor. In this manner, it is possible to obtain a work function suitable for each transistor using the same metal gate electrode. This technique, which is referred to as single metal—dual $\phi$ technique, was expected to solve the aforementioned problem related to the complex manufacturing process.

However, in the conventional single metal—dual φ technique, there is a problem in that the variation in work function of gate electrode caused by the implantation of impurity atoms is not constant, making it difficult to control. In Reference 1 and Reference 2, nitrogen ions are implanted into Mo (molybdenum) in similar manners. However, the work function of Reference 1 is decreased by 0.42 eV, while the work function of Reference 2 is increased by 0.70 eV. Thus, the directions of the variation in work function are opposite to each other. According to Reference 1, the implantation of only a small amount of the impurity results in a great change in the work function of the metal since the electronegativity of the impurity is great. However, as can be understood from the case of the implantation of N (nitrogen) into Mo, the control of work function using this mechanism is very difficult, and the requirement of the accuracy of threshold voltage with respect to the finished transistor product cannot be met.

SUMMARY OF THE INVENTION

The present invention has been made in consideration of the aforementioned circumstances, and it is an object of the present invention to provide a semiconductor device including a CMOS device having a metal gate electrode for which the variations in threshold voltage are in a narrow range, and a method of manufacturing the same.

A semiconductor device according to a first aspect of the present invention includes:

a first MIS transistor with a first conductivity type channel, including a first semiconductor region of a second conductivity type formed in a semiconductor substrate, a first gate insulating film formed on the first semiconductor region, a first gate electrode formed on the first gate insulating film, the first gate electrode being formed of a material for which a work function shows a value suitable for second conductivity type MIS transistors, and first source and drain regions formed in the first semiconductor region at both sides of the first gate electrode; and a second MIS transistor with a second conductivity type channel, including a second semiconductor region of the first conductivity type formed in the semiconductor substrate, a second gate insulating film formed on the second semiconductor region, a second gate electrode formed on the second gate insulating film, the second gate electrode being formed of a material for which a work function shows a value suitable for second conductivity type MIS transistors, and second source and drain regions formed in the second semiconductor region at both sides of the second gate electrode, wherein in a region in the first gate electrode at least 1 nm or less apart from an interface with the first gate insulating film in a film thickness direction, an oxygen concentration is $10^{20}$ cm$^{-3}$ or more and $10^{22}$ cm$^{-3}$ or less.

A method of manufacturing a semiconductor device according to a second aspect of the present invention includes:

in a semiconductor substrate including a first semiconductor region of a first conductivity type and a second semiconductor region of a second conductivity type, forming a first dummy gate in the first semiconductor region and forming a second dummy gate in the second semiconductor region;

forming first source and drain regions of the first conductivity type in the second semiconductor region at both sides of the second dummy gate;

forming second source and drain regions of the second conductivity type in the first semiconductor region at both sides of the first dummy gate;

forming an insulating film at side portions of the first and second dummy gates so that the first source and drain regions and the second source and drain regions are covered;

forming first and second grooves in the insulating layer by removing the first and second dummy gates;

forming a gate insulating film at least at bottom portions of the first and second grooves;

forming first and second gate electrodes on the gate insulating film at the bottom portions of the first and second grooves;

forming an oxygen dissociative absorption metal layer on the first and second gate electrodes so as to fill in the first and second grooves; and covering the oxygen dissociative absorption metal layer only at a portion on the second gate electrode with an oxygen diffusion barrier layer, and performing thermal processing in an atmosphere containing oxygen molecules.

A method of manufacturing a semiconductor device according to a third aspect of the present invention includes:

in a semiconductor substrate including a first semiconductor region of a first conductivity type and a second semiconductor region of a second conductivity type, forming a first gate insulating film in the first semiconductor region and forming a second gate insulating film in the second semiconductor region;

forming first and second gate electrodes on the first and second gate insulating films;

forming first source and drain regions of the first conductivity type in the second semiconductor region at both sides of the second gate electrode;

forming second source and drain regions of the second conductivity type in the first semiconductor region at both sides of the first gate electrode;

forming an insulating layer at side portions of the first and second gate electrodes so as to cover the first source and drain regions and the second source and drain regions;

forming an oxygen dissociative absorption metal layer which covers the first gate electrode but does not cover the second gate electrode; and performing thermal processing in an atmosphere containing oxygen molecules.

BRIEF DESCRIPTION OF THE DRAWINGS

FIG. 5A shows the electronegativity of cations constituting the gate electrode according to the general embodiment of the present invention; and FIG. 5B shows the electronegativity of cations constituting the gate insulating film.

FIG. 6 shows the work function of a material used to form the gate electrode of the general embodiment of the present invention.

DESCRIPTION OF THE EMBODIMENTS

Figure 1:
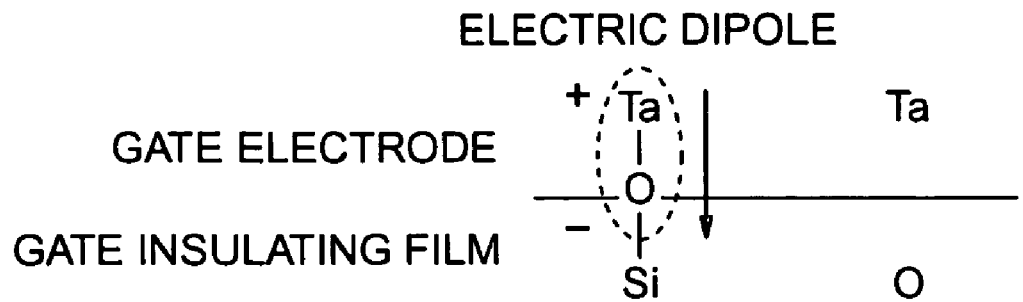
FIG. 1 is a drawing schematically showing the formation of a dipole due to oxygen at an interface between a gate insulating film and a gate electrode of a semiconductor device according to an embodiment of the present invention.

Hereinafter, embodiments of the present invention will be described in detail with reference to the accompanying drawings.

(Overview and Principle)

Before the embodiments of the present invention are described, an overview and a principle of a general embodiment of the present invention will be described below.

The general embodiment of the present invention is a semiconductor device including a CMOS device, in which gate electrodes of a p-channel MIS transistor and an n-channel MIS transistor are formed of materials having work functions suitable to form an n-channel MIS transistor. Furthermore, the oxygen concentration in the gate electrode of the p-channel MIS transistor in a direction of film thickness is maximum at the interface between the gate electrode and the gate insulating film, which is in a range of $10^{20}$ cm$^{-3}$ or more and $10^{22}$ cm$^{-3}$ or less.

In a conventional single metal—dual φ technique using oxygen or the like, the work function of a gate electrode material is changed by locally introducing oxygen thereinto. For example, as disclosed in R. Lin et al., "An Adjustable Work Function Technology Using Mo Gate for CMOS Devices", IEEE Electron Device Letters, vol. 23, pp. 49-51 (2004) (Reference 1), a change in work function is achieved by adding a very subtle amount of impurity. However, as reported in Reference 1 and T. Aoyama and Y. Nara, "Process Integration Issues on Mo-Metal-Gated MOSFETs with HfO$_2$ High-k Gate Dielectrics", Jap. J. Appl. Phys., vol. 44, pp. 2,283-2,287 (2005) (Reference 2), the direction of the change in work function, i.e., whether it is a positive direction or a negative direction, is not stable, resulting in that the reliability of this method has been low. In Japanese Patent Laid-Open Publication No. 2003-273350 (Reference 3), the control of work function using oxygen is performed with a physical mechanism similar to those of Reference 1 and Reference 2.

The structure of the general embodiment of the present invention differs from those of the aforementioned single metal—dual φ techniques. Specifically, in the general embodiment of the present invention, a greater amount of oxygen as compared with the conventional cases is supplied at the interface between the gate electrode and the gate insulating film, thereby forming a layer of dipoles containing cations and oxygen to form the gate electrode. It is possible to perform work function modulation more reliably as compared with the conventional cases due to the effect of this layer of dipoles.

In order to achieve work function modulation by the effect of dipoles as mentioned above, it is necessary to set the oxygen concentration to be $10^{20}$ cm$^{-3}$ or more, and $10^{22}$ cm$^{-3}$ or less. This is higher than the concentration in the conventional cases where the work function modulation of the gate electrode itself is performed. This can be proved by calculating the oxygen concentration of a conventional metal gate electrode. Reference 3 discloses a case where $10^{14}$ cm$^{-2}$ at maximum of oxygen ions are implanted into a metal with acceleration energy of 10 keV. When oxygen is injected with acceleration energy of 10 keV, there is a vertical direction struggle (width of the distribution of the implanted ions) of at least 10 nm or more. Accordingly, assuming that all the implanted ions are distributed in this distribution width, the concentration thereof is $10^{20}$ cm$^{-3}$. However, actually, not all the implanted ions are distributed in this distribution width, and an actual density becomes lower than this value (=$10^{20}$ $cm^{-3}$). In the conventional cases, a sufficient work function modulation effect can be obtained even with an oxygen concentration around this value.

Since the general embodiment of the present invention requires an oxygen concentration of $10^{20}$ $cm^{-3}$ or more, the controllability of work function can be improved as compared with the conventional cases, while there is a drawback that the specific resistance of the gate electrode is increased. However, when the oxygen concentration is $10^{22}$ $cm^{-3}$ or less, the carrier density in the gate electrode is substantially maintained at a level close to that of a metal. Accordingly, no gate depletion is caused, and a decrease in current drivability of transistor can be prevented. In addition, no such problems as a decrease in current drivability of transistor or variation in threshold voltage are caused due to the diffusion or penetration of impurity ions, as in the cases of polycrystalline silicon gates.

In order to obtain the aforementioned structure, atomic oxygen is introduced into a gate electrode, through which a grain boundary penetrates in a film thickness direction, and the thermal diffusion thereof is caused, thereby segregating the atomic oxygen toward the interface between the gate electrode and the gate insulating film. The grain boundary serves as a high-speed diffusion path for the oxygen atoms, thereby enabling a great amount of oxygen atoms to be localized at the interface. Furthermore, the oxygen atoms at the interface are easily coupled with cations (in this specification, metal ions or silicon ions) constituting the gate electrode, thereby enabling the formation of a dipole layer.

If oxygen molecules are supplied to the interface instead of oxygen atoms, it is unlikely that a dipole layer is formed, since in order to couple oxygen atoms with cations in the gate electrode, energy for dissociating oxygen molecules is required.

The problems arising in the cases of the introduction of nitrogen or fluorine proposed in R. Lin et al., "An Adjustable Work Function Technology Using Mo Gate for CMOS Devices", IEEE Electron Device Letters, vol. 23, pp. 49-51 (2004) (Reference 1) or T. Aoyama and Y. Nara, "Process Integration Issues on Mo-Metal-Gated MOSFETs with $HfO_2$ High-k Gate Dielectrics", Jap. J. Appl. Phys., vol. 44, pp. 2,283-2,287 (2005) (Reference 2) will be briefly described below. The use of nitrogen is not practical since the work function modulation effect of dipoles created at the interface using nitrogen is not so great. With respect to fluorine, there is a problem in that fluorine atoms cut the bonds between the metal (or silicon) and oxygen in the gate insulating film.

Next, the principle of the general embodiment of the present invention will be explained below taking as an example the case where tantalum (Ta) is used to form the gate electrode. When oxygen is added to the gate electrode in a p-channel MIS transistor including a gate insulating film of silicon and oxygen and a gate electrode of Ta, as shown in FIG. 2, the added oxygen and cation atoms constituting the gate electrode form a layer of dipoles (Ta—O) in a direction shown in FIG. 1 at an interface between the gate electrode and the gate insulating film. When the dipole layer is formed, a potential difference $V_{dipole}$ is caused by the dipoles. The potential difference $V_{dipole}$ can be expressed by the following equation:

$$V_{dipole} = q_{dipole} \cdot d \cdot N_{dipole}/(\in_0 \in_r)$$

where $q_{dipole}$ represents the elementary electric charge, d represents the thickness of the dipole layer, $N_{dipole}$ represents the number of diploes in a unit area, $\in_0$ represents the vacuum dielectric constant, and $\in_r$ represents the relative dielectric constant of the dipole layer.

Figure 3:
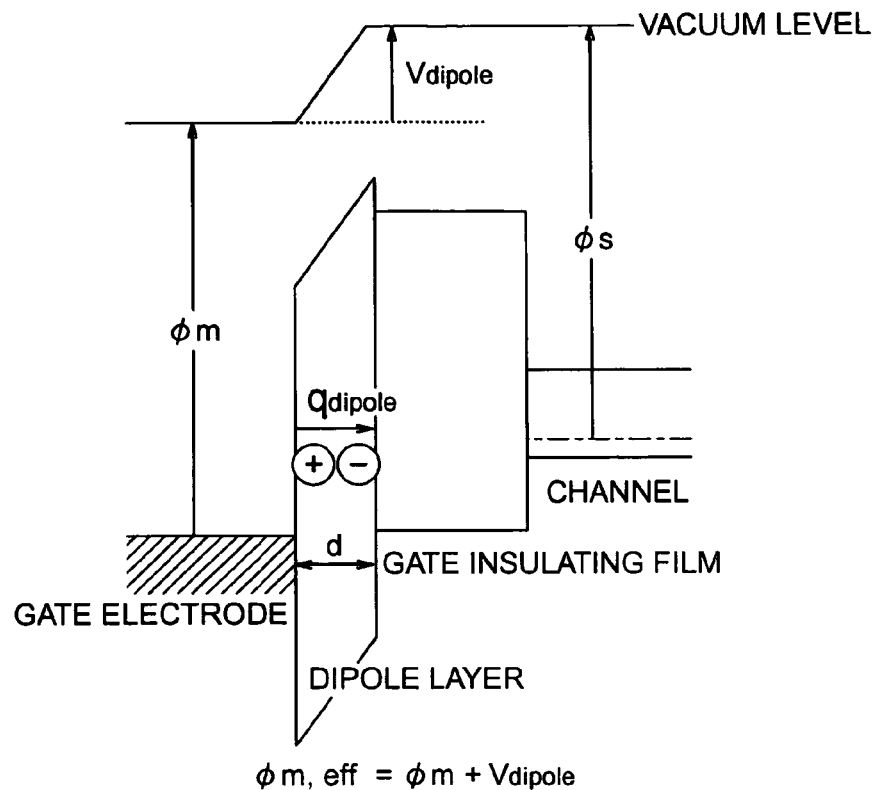
FIG. 3 is an energy band diagram showing the principle of work function modulation of the semiconductor device according to a general embodiment of the present invention.

As shown in FIG. 3, when a dipole layer is formed, the effective work function $\phi_{m,eff}$ can be obtained by the equation $$\phi_{m,eff} = \phi_m + V_{dipole}$$

where $\phi_m$ represents the vacuum work function. Thus, the effective work function $\phi_{m,eff}$ tends to increase.

Figure 4:
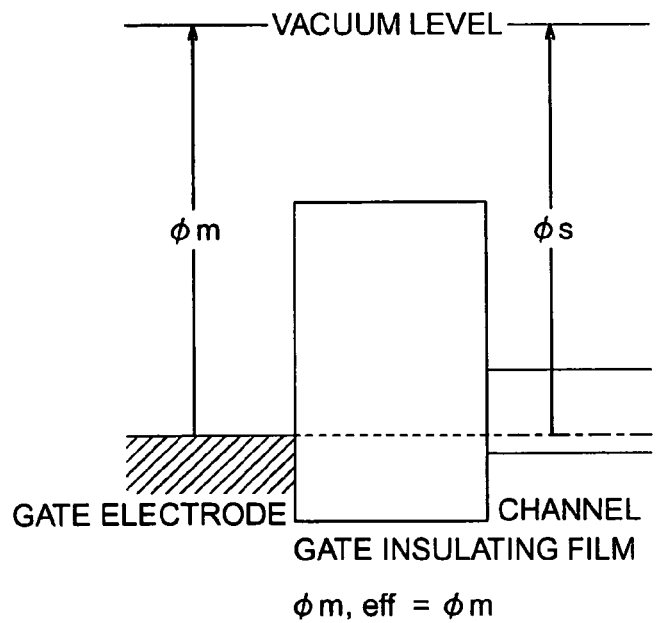
FIG. 4 is an energy band diagram in a case where no dipole exists around the interface between the gate insulating film and the gate electrode.

The inventors of the present invention have found that when the concentration of oxygen to be added is $10^{20}$ $cm^{-3}$ or more, the electric dipoles formed increase the effective work function of the gate electrode by about 0.4 V-1.0 V, thereby providing a work function suitable for p-channel MIS transistors. FIG. 4 is an energy band diagram in the case where there is no electric dipole at the interface. In FIGS. 3 and 4, $\phi$s denotes a channel surface work function.

Since the gate electrode of the n-channel MIS transistor does not contain oxygen, no electric dipole is formed, thereby maintaining a work function suitable for n-channel MIS transistors.

In this way, it is possible to form a desired CMOS device using the same gate electrode material to form a p-channel MIS transistor and an n-channel MIS transistor by adding oxygen only to the gate electrode of the p-channel MIS transistor, thereby increasing the effective work function.

Figure 2:
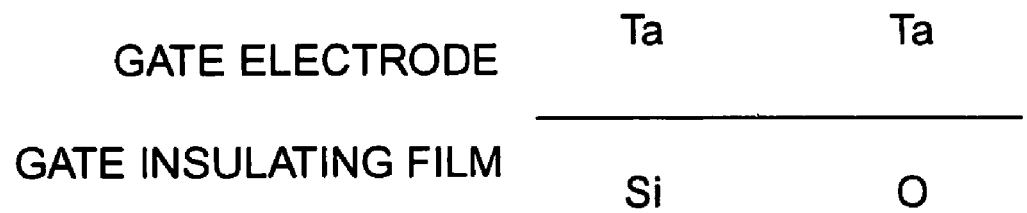
FIG. 2 is a drawing schematically showing the region around the interface between the gate insulating film and the gate electrode before oxygen is introduced.

Particular attention should be paid when there is a possibility that the oxygen atoms added form dipoles (O—Si) with cations constituting the gate insulating film, as shown in FIG. 1. The reason for this is that if the dipoles between the cations of the gate electrode and the oxygen atoms compensate for the dipoles between the cations of the gate insulating film and the oxygen atoms, it is not possible to obtain the effect of increasing the work function of the gate electrode of the p-channel MIS transistor according to the general embodiment of the present invention even if oxygen is added.

In order to avoid such a situation, according to the general embodiment of the present invention, the average electronegativity of the cation atoms contained at least in a region of the gate insulating film contacting the gate electrode is higher than the average electronegativity of the cation atoms contained in the gate electrode. In this way, if a Ta—O—Si bond is formed as shown in FIG. 1, an electric dipole is formed in a direction from Ta to Si, i.e., from the gate electrode to the gate insulating film, thereby increasing the effective work function of the oxygen-added gate electrode of the p-channel MIS transistor.

The material constituting the gate electrodes of the general embodiment of the present invention is selected from a group consisting of a metal selected from Ta, Nb, and V, a silicide of Ta, Nb, V, Ti, Zr, Hf, or a rare earth element such as La, and a boride of a rare earth element. Such materials have work functions suitable for n-channel MIS transistors. In addition, with such materials, it is possible to sufficiently decrease the average electronegativity of cation atoms constituting the gate insulating film compared to typical cation atoms. Thus, such materials are suitable to be used in the general embodiment of the present invention.

It is possible to form the gate electrodes according to the general embodiment of the present invention with a material selected from a metal nitride silicide containing Ta, Nb, V, Ti, Zr, Hf, or a rare earth element such as La. Although the specific resistance of these materials is slightly high due to nitrogen added thereto, these materials are appropriate to form the gate electrodes of the general embodiment according to the present invention since these materials have work functions suitable for n-channel MIS transistors, and can sufficiently decrease the average electronegativity of cation atoms.

The addition of nitrogen also restricts the reactivity of these materials with respect to the gate insulating film, which is also an advantage of the general embodiment of the present invention. Since the specific resistance of these materials is high, some countermeasures such as the stacking of low-resistance layers should be taken. However, the problem of depletion or penetration of the impurity, which is a serious problem of a silicon gate electrode, does not occur.

FIG. 5A shows the electronegativity of cations constituting the gate electrode of the general embodiment according to the present invention, and FIG. 5B shows the electronegativity of cations constituting the gate insulating film. In both the cases where the gate insulating film is formed of $SiO_2$ (SiON) and HfSiON (with the Hf concentration of 30%), the electronegativity of the gate electrode is lower than that of the gate insulating film. When oxygen is added to the interface between the gate electrode and the gate insulating film, dipoles are formed in a direction from the gate electrode to the gate insulating film, thereby increasing the effective work function. Thus, the effect of the general embodiment of the present invention can be obtained. When $SiO_2$ is compared with HfSiON, the electronegativity of $SiO_2$ is higher. Accordingly, the dipole moment generated by the addition of oxygen becomes greater, thereby increasing the effective work function of the gate electrode of the p-channel MIS transistor more efficiently.

As can be understood from FIGS. 5A and 5B, when a rare earth material such as Y and La, Hf, or Zr is used to form the gate electrode, the dipole formed with oxygen becomes greatest to produce the greatest work function modulation effect. In particular, when a high-k insulating film of, e.g., HfSiON, is used, it is preferable that the aforementioned materials be used to form the gate electrode.

FIG. 6 is a result of a measurement of the work function of the gate electrodes according to the general embodiment of the present invention. The values are in the range of 3.8 eV-4.4 eV. This is the ground for using the listed materials in the general embodiment of the present invention.

With the aforementioned structure, it is possible to provide a semiconductor device including a high performance metal gate CMOS device with the advantage of the conventional silicon gate electrode technique, i.e., the simplicity of process, being succeeded therein, but without having the problem of depletion or penetration of impurity.

First Embodiment

Figure 7:
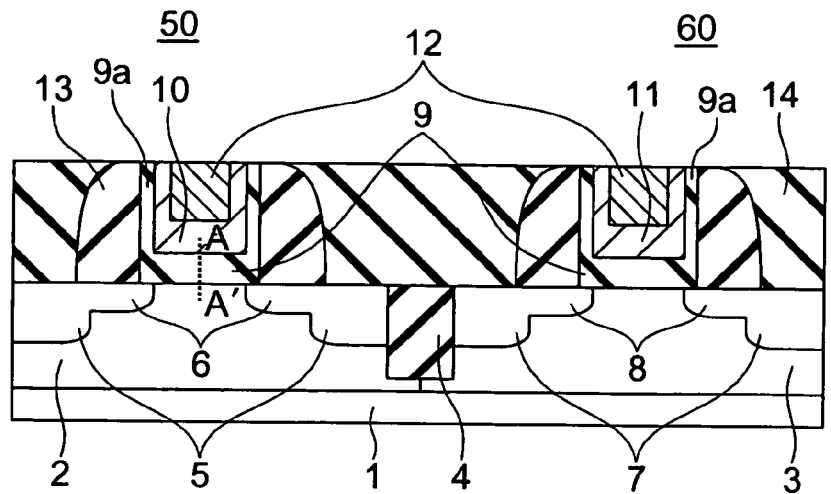
FIG. 7 is a sectional view of a semiconductor device according to a first embodiment of the present invention.

Next, a semiconductor device according to a first embodiment of the present invention will be described with reference to FIGS. 7 to 15. The semiconductor device of this embodiment is a CMOS device. FIG. 7 shows a sectional view of the structure thereof.

A semiconductor substrate 1 includes an n-type well region 2 and a p-type well region 3. The n-type well region 2 and the p-type well region 3 are isolated by an element isolation layer 4 having an STI (Shallow Trench Isolation) structure. A p-channel MIS transistor 50 is provided in the n-type well region 2, which has a p-type deep source/drain region 5, a p-type extension layer 6, a gate insulating film 9 and a first gate electrode 10. The gate insulating film 9 is formed on the n-type well region 2, and the first gate electrode 10 is formed on the gate insulating film 9. Furthermore, an oxygen dissociative absorption metal layer 12 is formed on the first gate electrode 10. In this embodiment, an insulating film 9a of the same material as the material of the gate insulating film 9 is formed at the side portions of the first gate electrode 10. In addition, sidewalls 13 of an insulating material are formed at both sides of the first gate electrode 10 with the insulating film 9a being provided therebetween.

The p-type extension layer 6 is formed in the n-type well region 2 at both sides of the first gate electrode 10, and the p-type deep source/drain region 5 is formed in the n-type well region 2 at both sides of the sidewall 13. The junction depth of the p-type deep source/drain region 5 with the n-type well region 2 is deeper than that of the p-type extension layer 6. The p-type deep source/drain region 5 and the p-type extension layer 6 serve as source and drain regions of the p-channel MIS transistor 50.

In the p-type well region 3, an n-channel MIS transistor 60 is formed. The n-channel MIS transistor 60 includes an n-type deep source/drain region 7, an n-type extension layer 8, a gate insulating film 9, and a second gate electrode 11. The gate insulating film 9 of the n-channel MIS transistor 60 is formed on the p-type well region 3, and the second gate electrode 11 is formed on the gate insulating film 9. An oxygen dissociative absorption metal layer 12 is provided on the second gate electrode 11. In this embodiment, an insulating film 9a of the same material as the material of the gate insulating film 9 is provided at both sides of the second gate electrode 11. In addition, sidewalls 13 are provided at both sides of the second gate electrode 11 with the insulating film 9a being provided therebetween.

The n-type extension layer 8 is provided in the p-type well region 3 at both sides of the second gate electrode 11, and the n-type deep source/drain region 7 is provided in the p-type well region 3 at both sides of the sidewall 13. The junction depth of the n-type deep source/drain region 7 with the p-type well region 3 is deeper than that of the n-type extension layer 8. The n-type deep source/drain region 7 and the n-type extension layer 8 serve as source and drain regions of the n-channel MIS transistor 60. The p-channel MIS transistor 50 and the n-channel MIS transistor 60 are covered by an interlayer insulating film 14.

The first gate electrode 10 of the p-channel MIS transistor 50 and the second gate electrode 11 of the n-channel MIS transistor 60 have work functions suitable for n-channel MIS transistors. It is preferable that the material of these gate electrodes be a metal selected from Ta, Nb, and V, a silicide of Ta, Nb, V, Ti, Zr, Hf, and a rare earth element such as La, and a boride of a rare earth element. The work functions of these materials are in the range of from 3.8 eV to 4.4 eV, so that these materials are suitable for setting the threshold voltage of an n-channel MIS transistor (see FIG. 6).

Since the aforementioned materials may cause partial reaction with respect to the gate insulating film when being exposed to a high-temperature environment of 800° C. or more, it is desirable that the temperature at the manufacturing process be maintained to be less than 800° C. From this viewpoint, in this embodiment, the CMOS transistors containing such electrode materials are most effectively manufactured by a replacement gate process, in which the gate stack structure is not subjected to high-temperature processing such as the activation of the deep source/drain region. As a result, the device structure of this embodiment becomes one specific to the replacement gate process, as shown in FIG. 7.

The first gate electrode 10 of the p-channel MIS transistor 50 in this embodiment contains oxygen at least at the portion contacting the gate insulating film 9. The electric dipoles formed by the bonding of the oxygen with cation atoms constituting the first gate electrode 10 increase the effective work function of the first gate electrode 10 by about 0.4 eV-1.0 eV, to become 4.8 eV or more, thereby setting the threshold voltage of the p-channel MIS transistor to be a suitable value.

Next, a method of manufacturing the semiconductor device of the first embodiment will be described below.

The method of manufacturing the semiconductor device in this embodiment employs the so-called replacement gate process to form the transistors. The manufacturing process is shown in FIGS. 8 to 13. In this manufacturing method, Ta (tantalum) is used to form the first and second gate electrodes.

Figure 8:
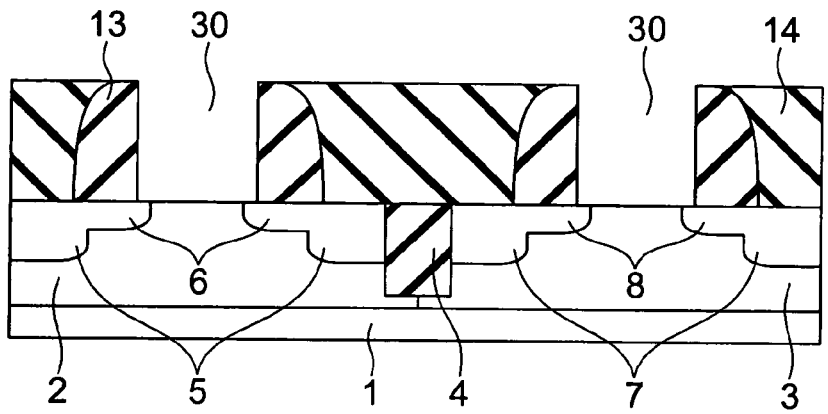
FIG. 8 is a sectional view showing a step of the process of manufacturing the semiconductor device according to the first embodiment.

First, as shown in FIG. 8, an n-type well region 2 and a p-type well region 3 isolated by an element isolation layer 4 having an STI structure are formed on the semiconductor substrate 1. Subsequently, dummy gates (not shown) are formed in the n-type well region 2 and the p-type well region 3, and a p-type extension layer 6 is formed by implanting a p-type impurity into the n-type well region 2 using the dummy gate as a mask, and an n-type extension layer 8 is formed by implanting an n-type impurity into the p-type well region 3. Thereafter, a sidewall layer 13 is formed at the side portions of the dummy gates. Then, a p-type deep source/drain region 5 is formed by implanting a p-type impurity into the n-type well region 2 using the dummy gate and the sidewall layer 13 as masks, and an n-type deep source/drain region 7 is formed by implanting an n-type impurity into the p-type well region 3. Subsequently, an interlayer insulating film 14 is deposited and flattened. Thereafter, the dummy gates are removed, thereby obtaining the structure shown in FIG. 8. As can be understood from FIG. 8, after the dummy gates are removed, trenches 30 are formed. A silicide layer can be formed on the deep source/drain region 5 and 7.

Figure 9:
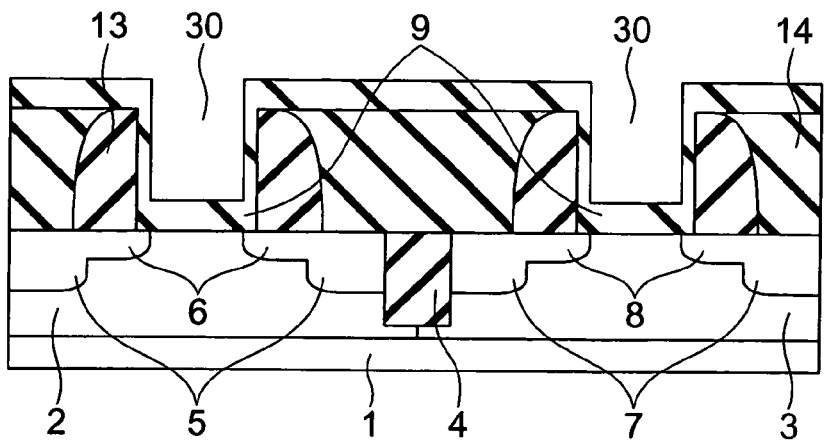
FIG. 9 is a sectional view showing a step of the process of manufacturing the semiconductor device according to the first embodiment.

Next, as shown in FIG. 9, a gate insulating material film 9 is deposited. For example, 3 nm of hafnium silicate can be deposited by an ALD (atomic layer deposition) method. The deposition method can be another method such as the CVD method as long as an insulating film is formed along the bottom and side portions of the trenches 30 after the dummy gates are removed. As mentioned before, the material of the gate insulating material film 9 should satisfy the condition that the average electronegativity of cation atoms constituting the material is greater than the average electronegativity of the cation atoms constituting the material of the gate electrode. Accordingly, in this embodiment, hafnium silicate containing 30% of Hf (hafnium) is deposited to form the gate insulating film 9.

Figure 10:
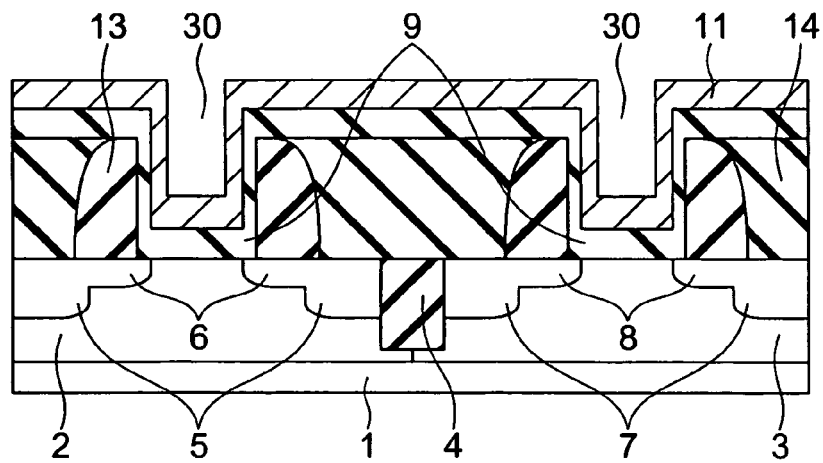
FIG. 10 is a sectional view showing a step of the process of manufacturing the semiconductor device according to the first embodiment.

Next, as shown in FIG. 10, a gate electrode material film 11 is deposited on and along the gate insulating material film 9. In this embodiment, 10 nm of Ta is deposited by an MOCVD method. The material of the gate electrode material film 11 is selected from a metal selected from Ta, Nb, and V, a silicide containing Ta, Nb, V, Ti, Zr, Hf, or a rare earth element such as La, and a boride containing a rare earth element. A film formed of any of such electrode materials has a grain boundary penetrating the film in the direction of film thickness.

Figure 11:
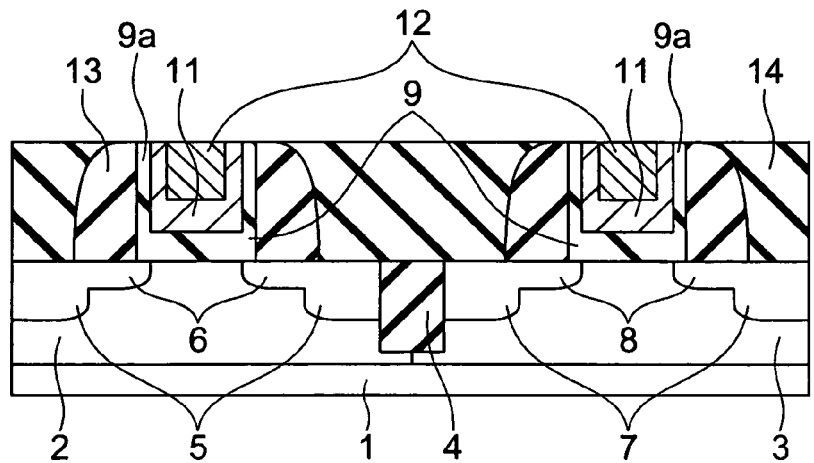
FIG. 11 is a sectional view showing a step of the process of manufacturing the semiconductor device according to the first embodiment.

Next, an oxygen dissociative absorption metal layer 12 of W (tungsten), for example, is deposited by an MOCVD method, for example, to fill in the trenches 30, and flattened by a typical chemical mechanical polishing (CMP) process, thereby forming the gate insulating film 9, the insulating film 9a, and the gate electrodes 11 on the p-channel MIS transistor forming region and the n-channel MIS transistor forming region, as shown in FIG. 11.

Figure 12:
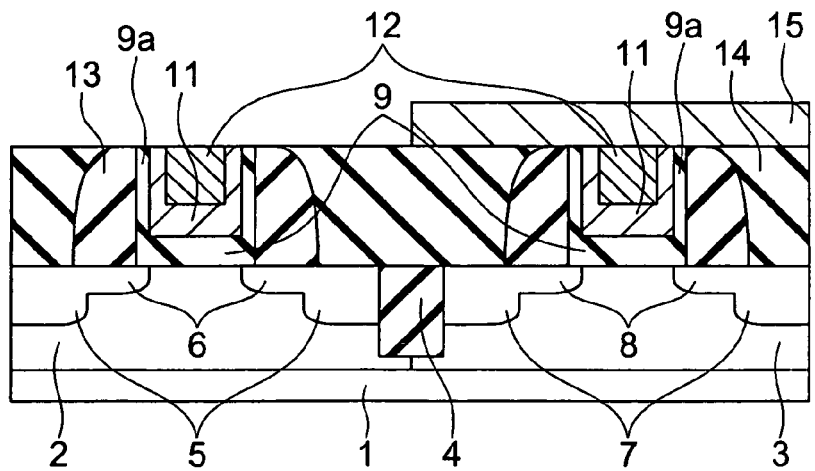
FIG. 12 is a sectional view showing a step of the process of manufacturing the semiconductor device according to the first embodiment.

Subsequently, as shown in FIG. 12, an oxygen diffusion barrier layer 15 of SiN, for example, is formed only on the n-channel MIS transistor forming region using a typical photolithography process. This layer should be thick enough not to pass oxygen in the oxygen diffusion step performed later. In this case, 50 nm of SiN is deposited.

Figure 13:
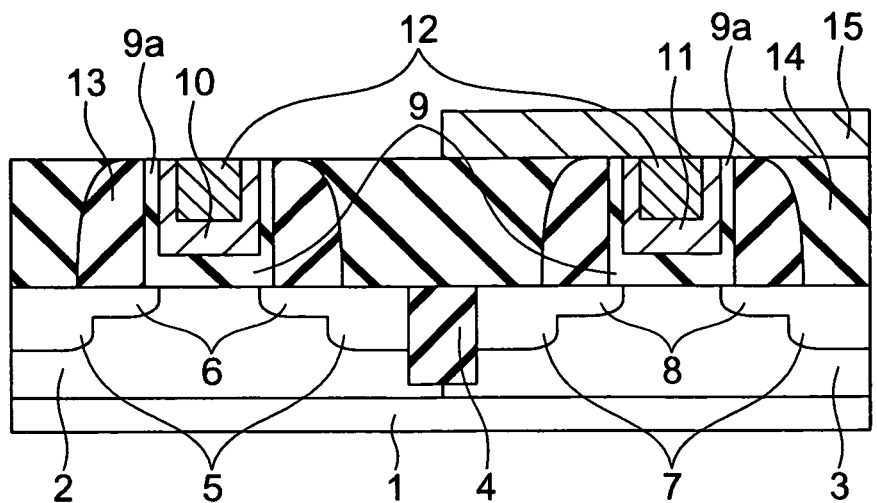
FIG. 13 is a sectional view showing a step of the process of manufacturing the semiconductor device according to the first embodiment.

Next, oxygen is introduced into the gate electrode 11 on the p-channel MIS transistor forming region by performing thermal processing in a normal oxygen molecular atmosphere, thereby changing the gate electrode 11 to a first gate electrode 10 (FIG. 13).

In this embodiment, molecular oxygen, which is the ordinary state of oxygen gas used in an LSI process, is dissociated to become atomic oxygen, on the surface of the oxygen dissociative absorption metal layer 12 of W (tungsten), and the atomic oxygen diffuses along the grain boundary in the gate electrode 11 of W or Ta at a high speed, thereby easily reaching the interface with the gate insulating film 9. Besides W, Pt, Pd, Rh, and the like can be used as an oxygen dissociative absorption metal. However, it is preferable from the viewpoint of chemical and thermal stability that either W or Pt be used.

If a Ta layer is formed on the gate electrode 10 instead of the oxygen dissociative absorption metal layer 12, i.e., if the gate electrode and a layer formed thereon is formed of a single Ta layer, oxygen diffuses into the gate electrode of Ta and reaches the interface in a molecular state since the single Ta layer does not have a dissociative absorption effect with respect to oxygen molecules. In such a case, no dipole layer is formed since the oxygen molecule dissociation energy is required to form dipoles of Ta and oxygen.

Even if a single Ta layer is formed, it is possible to effectively introduce oxygen as in the case of this embodiment, in which a W (tungsten) layer is formed on the gate electrode, by performing diffusion processing in advance in an atmosphere containing atomic oxygen. However, the use of W is more profitable since the manufacturing process can be simplified because, e.g., no omitting atomic oxygen generating apparatus is necessary. In addition, the atomic oxygen supply efficiency can even be improved when W is used, compared to the case where the atomic oxygen generating apparatus is used. Furthermore, it is possible to avoid damage to devices caused by plasma for generating atomic oxygen.

Since the specific resistance of W is lower than the gate electrode materials listed in FIG. 6, an effect of decreasing the parasitic resistance of a gate electrode can be obtained by forming the W layer on the gate electrode.

Since the thermal processing conditions are considerably changed depending on the gate electrode material used, and the layer thickness thereof, it is not so meaningful to strictly determine the temperature and time. The only condition is to effectively bring oxygen to the interface between the gate electrode and the gate insulating film. The upper limit with respect to the temperature in the oxygen introducing process should be less than 800° C. since the materials of the gate electrode selectable in the first embodiment possibly cause chemical reaction with the gate insulating film at a temperature of 800° C. or more.

It is preferable that the thickness of the gate electrode be 2 nm or more and 100 nm or less. The thinner the thickness of the gate electrode is, the more easily oxygen is supplied to the interface with the gate insulating film. However, if the thickness of the gate electrode is too thin, the work function specific to the material used cannot be obtained. The critical value of the thickness is 2 nm. Accordingly, the thickness of the gate electrode in this embodiment should be 2 nm or more.

On the other hand, if the thickness of the gate electrode is 100 nm or more, the aspect ratio with the gate length in the technical generation in which the technique of the present invention is expected to be used becomes very large, e.g., 5 or more, resulting in that the process of forming the gate insulating film and the gate electrode in this embodiment becomes very difficult. Accordingly, the thickness of the gate electrode should be 100 nm or less.

The amount of oxygen contained in the first gate electrode at the interface with the gate insulating film is preferably $10^{20}$ cm$^{-3}$ or more and $10^{22}$ cm$^{-3}$ or less. If the lower limit of the oxygen concentration is not $10^{20}$ cm$^{-3}$ or more, the amount of dipoles formed with the cation atoms in the gate electrode becomes short, and it is not possible to obtain a work function modulation function from a work function suitable for n-channel MIS transistors to a work function suitable for p-channel MIS transistors. The upper limit of the oxygen concentration is set because if the amount of oxygen introduced is too much, the specific resistance of the gate electrode is drastically increased, resulting in that the depletion restricting effect, which is the original object of the present invention, may not be obtained. According to an experiment using Ta, the specific resistance critically is increased when the oxygen concentration reaches about $10^{22}$ cm$^{-3}$, and the depletion restricting effect cannot be obtained at all with this oxygen concentration. Since a gradual increase in specific resistance is observed even in an oxygen concentration range of $10^{22}$ cm$^{-3}$ or less, it is preferable that the oxygen concentration be as low as possible considering the objective of the present invention to decrease the specific resistance of the gate electrode. Thus, it is most preferable that the oxygen concentration be $10^{20}$ cm$^{-3}$ or more and $5\times10^{21}$ cm$^{-3}$ or less.

The same limitation with respect to the oxygen concentration applies to gate electrode materials other than Ta used in this embodiment. The reason for this is that the lower limit relates to the electric dipole function, which is not limited by the electrode material, and that the upper limit determined by the critical increase in specific resistance is presumed to relate to the change in energy band structure from a metal state to an insulating material state and therefore the critical oxygen concentration cannot be considerably different among a metal selected from Ta, Nb, and V, a silicide of Ta, Nb, V, Ti, Zr, Hf, or a rare earth element such as La, and a boride of a rare earth element.

Finally, the CMOS device shown in FIG. 7 is completed by removing the oxygen diffusion barrier layer 15 of SiN shown in FIG. 13 by wet etching using, e.g., phosphoric acid.

Figure 14:
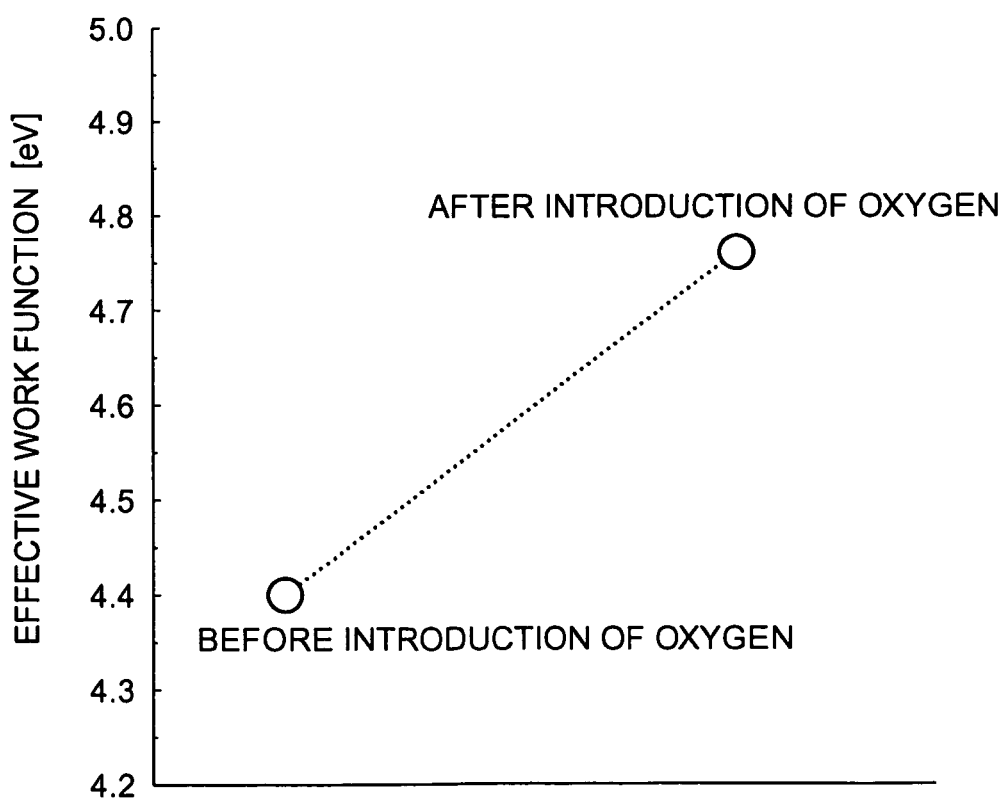
FIG. 14 shows the result of an experiment proving the work function modulation effect of the first embodiment.

FIG. 14 shows the result of an experiment to determine the change in work function caused by the introduction of oxygen in the semiconductor device of this embodiment including the gate electrode 10 of W/Ta, and the gate insulating film 9 of hafnium silicate. Before oxygen is introduced, i.e., when the second gate electrode 11 of the n-channel MIS transistor 60 is in the state shown in FIG. 7, the effective work function is about 4.4 eV, which is suitable for n-channel MIS transistors. After oxygen is introduced, the work function is increased to about 4.8 eV, which is suitable for the p-channel MIS transistor 50.

Figure 15:
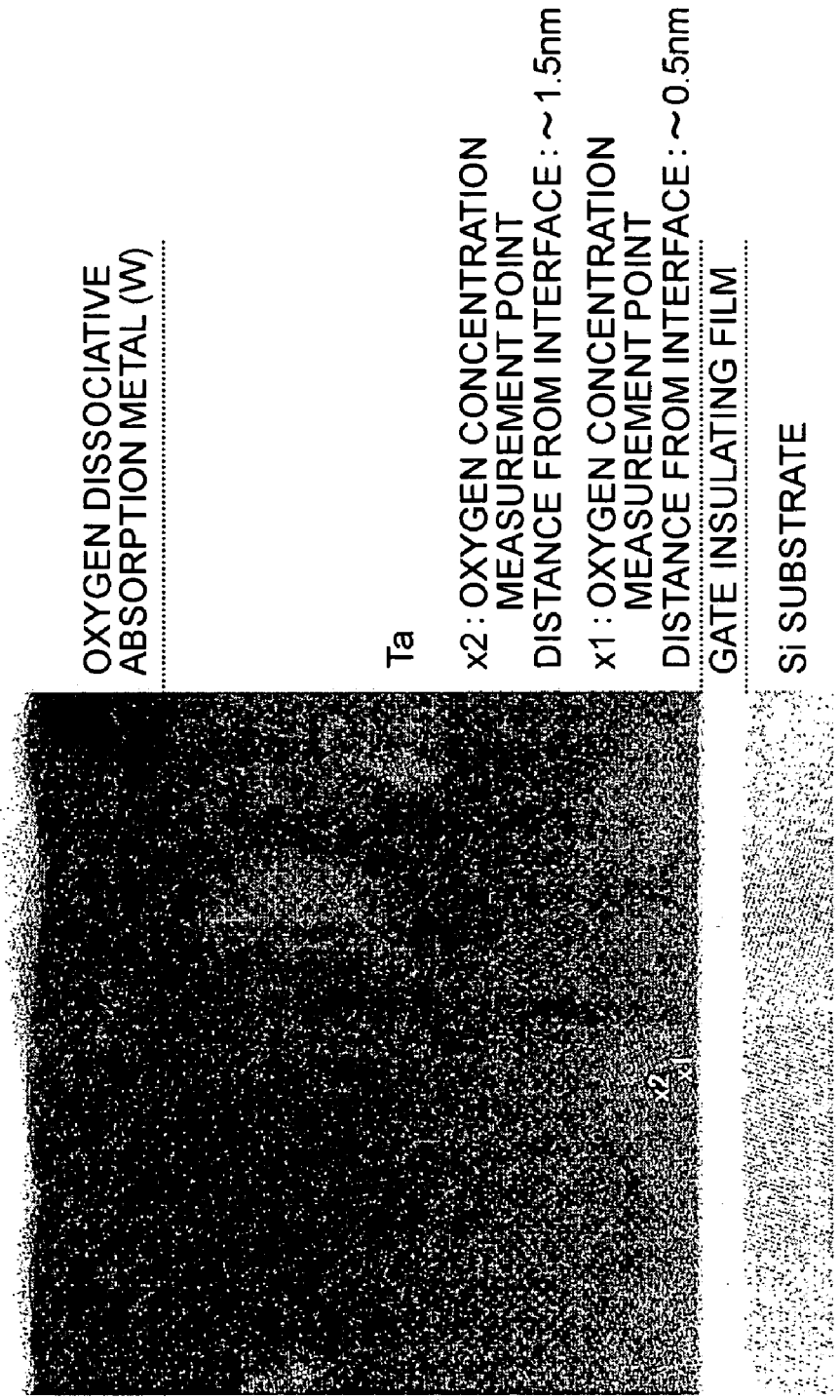
FIG. 15 is a photograph of a region near the interface between the gate electrode and the gate insulating film according to the first embodiment, viewed using a transmission electron microscope.

FIG. 15 shows the result of the observation using a transmission electron microscope (TEM) of a cross-section (taken along line A-A' in FIG. 7) of a region around the interface between the first gate electrode 10 and the gate insulating film 9 of the p-channel MIS transistor 50. At the point 1 shown in FIG. 15, which is 0.5 nm apart from the interface between the gate electrode and the gate insulating film, a local element analysis was performed using Energy Dispersive X-ray Spectroscopy (EDX) utilizing an electron beam of TEM converged to have a diameter of about 1 nm, and about $10^{21}$ cm$^{-3}$ of oxygen was detected besides Ta. From this result, it can be understood that there is about $10^{21}$ cm$^{-3}$ of oxygen at the interface between the gate electrode and the gate insulating film.

Although oxygen was also detected at the point 2 in FIG. 15, which is 1.5 nm apart from the interface between the gate electrode and the gate insulating film, the concentration thereof was about $10^{20}$ cm$^{-3}$. These two measurement points are 1 nm apart from each other, and the spatial resolution of these two points can be easily obtained by an EDX element analysis using TEM electron beam having a diameter of 1 nm. The oxygen concentration at the measurement point 1 shows oxygen existing at the interface and forming the dipole layer, and the oxygen concentration at the measurement point 2 shows part of atomic oxygen having diffused along the Ta grain boundary by thermal diffusion and having been trapped by the grain boundary.

Figure 27:
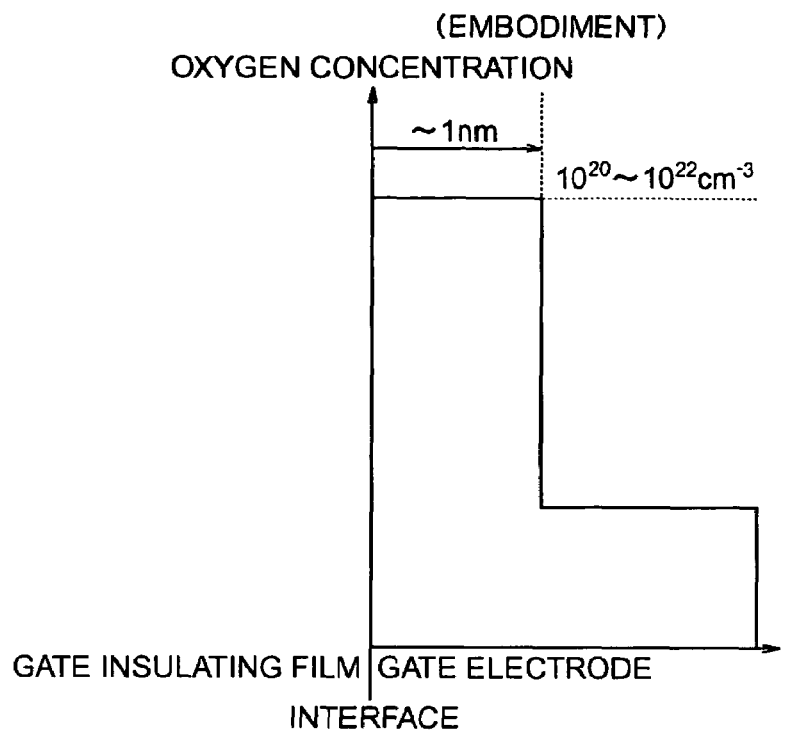
FIG. 27 shows an oxygen concentration distribution in a region around the interface between the first gate electrode and the gate insulating film of the first embodiment.

Accordingly, it can be understood that as shown in FIG. 27, in the semiconductor device of this embodiment, the oxygen concentration in a region in the first gate electrode at least 1 nm or less apart from the interface with the gate insulating film in the thickness direction is $10^{20}$ cm$^{-3}$ or more and $10^{22}$ cm$^{-3}$ or less. In contrast, when the ion implantation method described in Japanese Patent Laid-Open Publication No. 2003-273350 (Reference 3) is used, the oxygen concentration in the gate electrode 5 nm or less apart from the interface with the gate insulating film in the thickness direction is less than $10^{20}$ cm$^{-3}$ as shown in FIG. 28.

Figure 28:
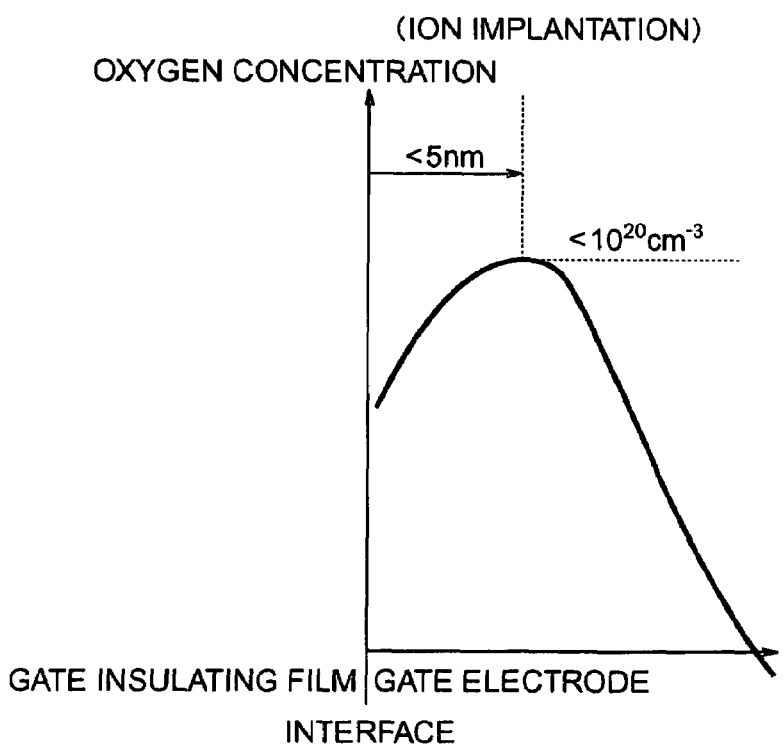
FIG. 28 shows an oxygen concentration distribution in the gate electrode in a case where oxygen is introduced into a region around the interface between the gate electrode and the gate insulating film by an ion implantation method.

It can be presumed that the actual oxygen concentration within the gate electrode is not constant in the region 1 nm apart from the interface as shown in FIG. 28, but has a profile higher at a point closer to the interface, and gradually lower as the distance from the interface increases. An electron beam of TEM was converged to have a diameter of 0.2 nm, and the bonding state of Ta was analyzed from the transmission electron energy loss spectrum with the spatial resolution of 0.2 nm. As a result, it was understood that Ta was almost completely oxidized at the points 0.1 nm apart from the interface. In contrast, it was understood that the state of Ta continually changed from an oxidized state to a metal state as the distance from the interface increased. It is not possible to know the average oxygen concentration in the region within 0.2 nm from the interface since with the state-of-the-art analytical technique, although it is possible to know the bonding state of Ta, it is not possible to perform quantitative analysis of oxygen with the spatial resolution of 0.2 nm. However, it is certain that with the oxygen distribution of this embodiment, the oxygen concentration shows a maximum value in the electrode 0.2 nm apart from the interface.

In the first embodiment, the work function of a metal selected from Ta, Nb, and V, or a silicide containing a metal selected from Ta, Nb, V, Ti, Zr, and Hf is about 4.3 eV at the lowest, (see FIG. 6), resulting in that the threshold value of the work function becomes greater than that of a conventional n$^+$ silicon gate by 0.2 eV-0.3 eV. Accordingly, it is preferable that the semiconductor device using such electrode materials of the first embodiment be a CMOS device formed on an SOI (Silicon On Insulator) substrate instead of a CMOS device formed on a bulk substrate in order to obtain a CMOS device with higher performance.

The work function of a silicide or boride of a rare earth element such as La is about 4.0 eV, which is about the same as that of a conventional n$^+$ silicon gate (see FIG. 6). Thus, using these gate electrode materials, the present invention can be applied to a conventional bulk-type CMOS device.

As described above, according to this embodiment, it is possible to obtain a CMOS device including a gate electrode in which variations in threshold voltage are not so great. Furthermore, it is possible to obtain a low-resistance and heat-resistive CMOS device which does not have a problem of depletion and diffusion or penetration of an impurity. In addition, it is possible to prevent an increase in the number of manufacturing steps when such a COMS device is manufactured, and to omit complicated processing.

When hafnium silicide is selected as the gate electrode material of this embodiment, it is preferable that the main constituent thereof be orthorhombic $HfSi_2$. First, $HfSi_2$ is the most stable hafnium silicide from a viewpoint of thermodynamics, and $HfSi_2$ is most preferable in consideration of the LSI manufacturing process performed after the silicide is formed. Second, the gate electrode of this embodiment requires a grain boundary penetrating the gate electrode, which serves as a diffusion path for oxygen atoms. With $HfSi_2$, which is stable in a thermodynamics sense, it is possible to easily grow grains, resulting in that it is possible to easily form a single grain in a thickness direction. Thus, $HfSi_2$ is the optimum material in this embodiment.

For a similar reason, when a silicide containing a metal other than hafnium is selected as the gate electrode material in this embodiment, it is preferable that a silicide having a stable composition in a thermodynamic sense be used. For example, orthorhombic $TiSi_2$, orthorhombic $ZrSi_2$, hexagonal $TaSi_2$, hexagonal $NbSi_2$, hexagonal $VSi_2$, hexagonal $Er_3Si_5$, and so on can be used.

At this time, it is preferable that the ratio of the most stable silicide phase, in which the aforementioned thermal stability and the secure formation of the oxygen diffusion path can be effectively performed, to the entire layer be 50% at the lowest. If this ratio is 50% or less, the shift of atoms between a quasi-stable silicide phase and the most stable silicide phase becomes remarkable, thereby revealing the degradation in morphology in the gate electrode, from the viewpoint of thermal stability. From the viewpoint of the secure formation of oxygen diffusion path, if the ratio of the most stable silicide phase becomes less than 50%, a plurality of crystal grains (the most stable and the quasi stable silicide phases) appear in the thickness direction, thereby considerably degrading the continuity of grain boundary.

Second Embodiment

Figure 16:
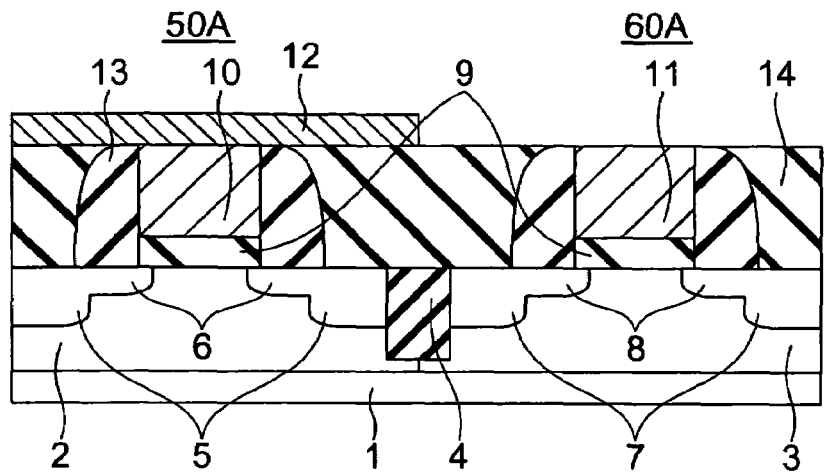
FIG. 16 is a sectional view of a CMOS device according to a second embodiment of the present invention.

Next, a CMOS device according to a second embodiment of the present invention will be described below with reference to FIGS. 16 to 21. FIG. 16 shows a sectional view of the CMOS device of this embodiment.

A semiconductor substrate 1 includes an n-type well region 2 and a p-type well region 3, which are isolated by an element isolation layer 4 having an STI (Shallow Trench Isolation) structure. A p-channel MIS transistor 50 is provided in the n-type well region 2, and an n-channel MIS transistor 60 is provided in the p-type well region 3.

The p-channel MIS transistor 50A includes a gate insulating film 9, a first gate electrode 10 formed on the gate insulating film 9, a p-type extension layer 6 formed in the n-type well region 2 at both sides of the first gate electrode 10, a sidewall layer 13 of an insulating material formed at side portions of the first gate electrode 10, a p-type deep source/drain region 5 formed in the n-type well region 2 at both sides of the sidewall layer 13, and an oxygen dissociative absorption metal layer 12 formed on the first gate electrode 10. The junction depth of the p-type deep source/drain region 5 with respect to the n-type well region 2 is adjusted to be deeper than that of the p-type extension layer 6. The p-type deep source/drain region 5 and the p-type extension layer 6 serve as source and drain regions of the p-channel MIS transistor 50A.

The n-channel MIS transistor 60A includes a gate insulating film 9, a second gate electrode 11 formed on the gate insulating film 9, an n-type extension layer 8 formed in the p-type well region 3 at both sides of the second gate electrode 11, a sidewall layer 13 of an insulating material formed at side portions of the second gate electrode 11, and an n-type deep source/drain region 7 formed in the p-type well region 3 at both sides of the sidewall layer 13. The junction depth of the n-type deep source/drain region 7 with respect to the p-type well region 3 is adjusted to be deeper than that of the n-type extension layer 8. The n-type deep source/drain region 7 and the n-type extension layer 8 serve as source and drain regions of the n-channel MIS transistor 60A.

As the electrode material having a work function suitable to form an n-channel MIS transistor, a metal silicide of Ta, Nb, V, Ti, Zr, Hf, or a rare earth element such as La is selected, and the first gate electrode 10 of the p-channel MIS transistor 50A and the second gate electrode 11 of the n-channel MIS transistor 60A are formed of this metal. The work functions of these materials are about 3.8 eV-4.4 eV, which are suitable to set the threshold voltage of an n-channel MIS transistor (see FIG. 6). These silicides can be formed by a technique (total silicidation technique) in which after a CMOS transistor is formed using a conventional gate electrode technique to form a silicon gate electrode, silicidation reaction is caused between the silicon gate and a metal deposited on the silicon gate to completely change the silicon gate to a metal silicides gate.

As explained in the descriptions of the first embodiment, the p-channel MIS transistor 50A and the n-channel MIS transistor 60A in this embodiment also include gate electrodes having work functions suitable for n-channel MIS transistors, and the effective work functions of the gate electrode of the p-channel MIS transistor are increased by selectively adding oxygen thereto. In the semiconductor device of this embodiment, the oxygen concentration in the first gate electrode in a region at least 1 nm or less apart from the interface with the gate insulating film in the thickness direction is $10^{20}$ cm$^{-3}$ or more and $10^{22}$ cm$^{-3}$ or less, as in the case of the first embodiment.

In this embodiment, after the p-channel MIS transistor 50A and the n-channel MIS transistor 60A are formed using a known total silicidation technique, an oxygen dissociative absorption metal layer 12 is formed only on the p-channel MIS transistor 50A, and oxygen is selectively introduced into the first gate electrode 10 of the p-channel MIS transistor 50A.

In this embodiment, oxygen is contained in at least a region in the first gate electrode 10 of the p-channel MIS transistor 50A contacting the gate insulating film 9. The electric dipoles formed by the oxygen with the cation atoms constituting the first gate electrode 10 increase the effective work function of the first gate electrode 10 by about 0.4 eV-1.0 eV to become 4.8 eV or more, thereby setting the threshold voltage of the p-channel MIS transistor to be an appropriate value.

Next, a method of manufacturing a CMOS device according to the second embodiment will be described below with reference to FIGS. 17 to 20. In this manufacturing method, hafnium silicide is used to form the first and second gate electrodes.

Figure 17:
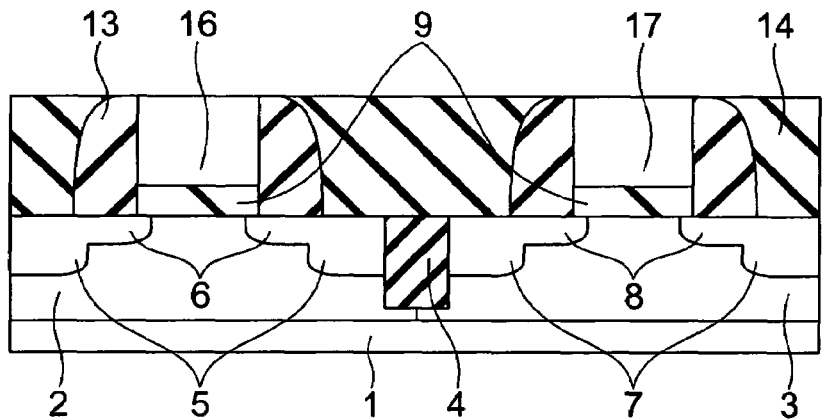
FIG. 17 is a sectional view showing a step of the process of manufacturing the semiconductor device according to the second embodiment.

First, a CMOS transistor as shown in FIG. 17 is formed by a typical silicon gate transistor forming process. The thickness of silicon gates 16 and 17 is 100 nm, and a gate insulating film 9 is an SiON film with an equivalent $SiO_2$ film thickness of 1.0 nm. It is required that no p-type impurity such as boron is introduced into the silicon gate 16 of the p-channel MIS transistor 50A when a p-type deep source/drain region 5 and a p-type extension layer 6 are formed. Otherwise, the metal-silicon reaction caused in the total silicidation process performed later is considerably inhibited by the p-type impurity, thereby degrading the reaction speed. As a result, total silicidation cannot be performed smoothly at the gate electrode of the p-channel MIS transistor.

On the other hand, an impurity such as phosphorous or arsenic can be added to the silicon gate 17 of the n-channel MIS transistor 60A. The reason for this is that it has been proven that an n-type impurity does not inhibit silicidation reaction. With such a structure, it is possible to uniformly perform silicidation on the p-channel MIS transistor and the n-channel MIS transistor at a constant speed.

Figure 18:
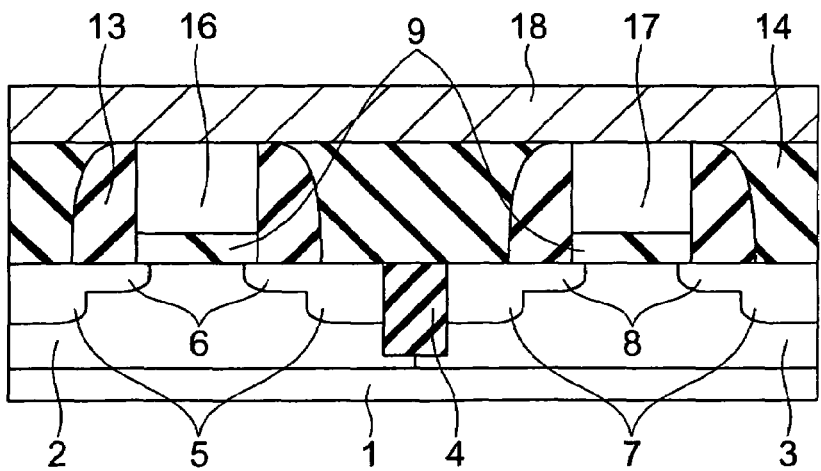
FIG. 18 is a sectional view showing a step of the process of manufacturing the semiconductor device according to the second embodiment.

Next, as shown in FIG. 18, a layer 18 of a silicidation metal, e.g., hafnium in this embodiment, having a thickness of 100 nm is deposited by a sputtering method. This layer can be deposited using a method other than a sputtering method.

Thereafter, a solid state reaction (silicidation reaction) between hafnium in the hafnium layer 18 and the silicon gates 16 and 17 is caused by rapid thermal processing at a temperature of 800° C. for 60 seconds. Since the silicon gate 16 of the p-channel MIS transistor 50A is non-doped, as described above, the silicidation reaction in the n-channel MIS transistor 60A and the p-channel MIS transistor 50A proceeds at the same speed, thereby changing the gate electrodes of these transistors to completely equivalent hafnium silicide gate electrodes.

Figure 19:
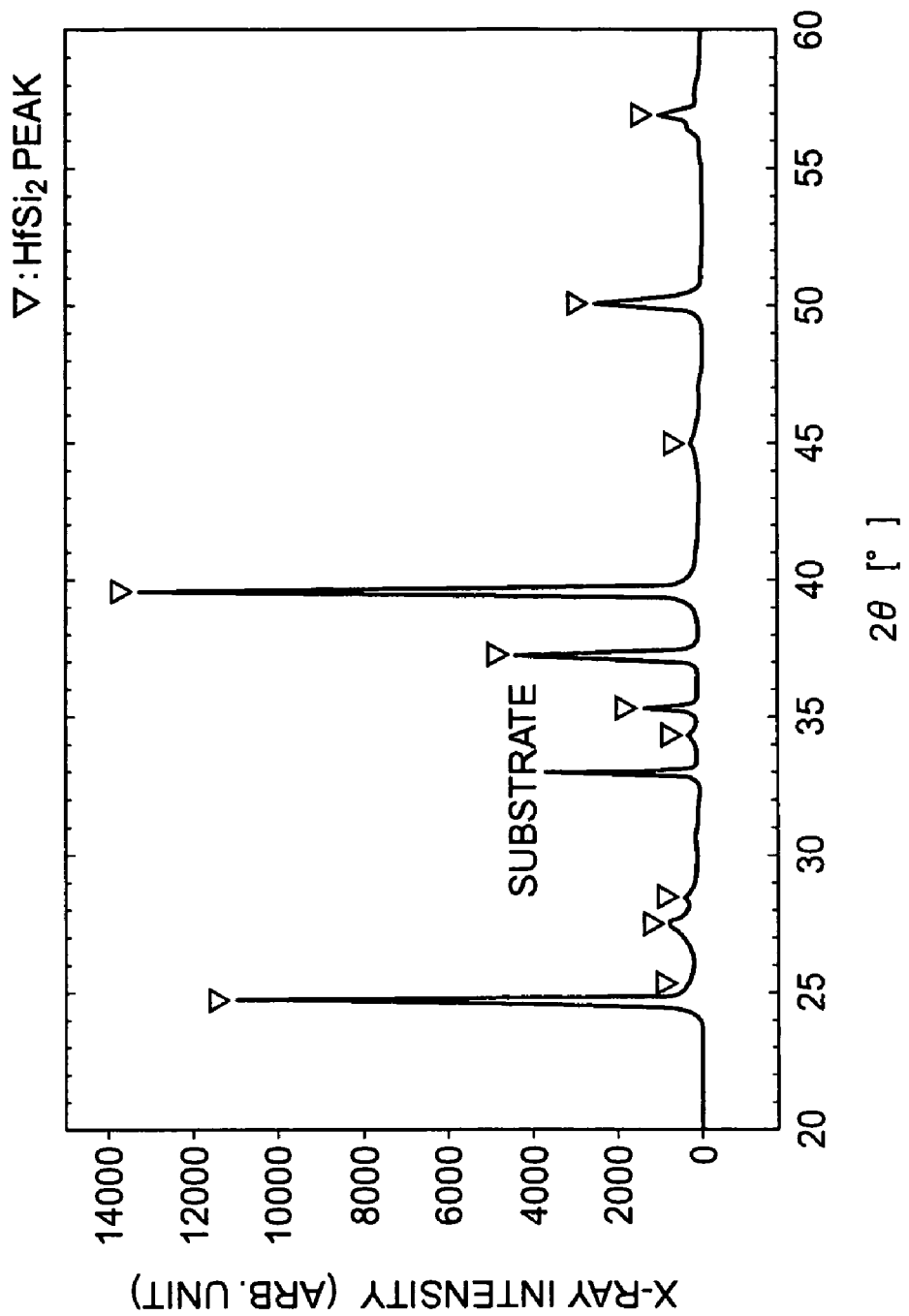
FIG. 19 shows a crystalline structure of the gate electrode of the second embodiment.

In this embodiment, it has been proven by the x-ray diffraction method that the main constituent of the hafnium silicide is $HfSi_2$, and the crystal system is orthorhombic system. FIG. 19 shows the analysis result. This result is obtained from an experiment in which a hafnium silicide film formed by causing a reaction between hafnium and a silicon gate under the aforementioned conditions was analyzed using x-ray diffraction. As shown in the drawing, there are diffraction peaks showing the formation of orthorhombic $HfSi_2$. It is possible to determine the composition of the hafnium silicide by an EDX analysis using a cross-section TEM method performed on a cross-section of a completed MOSFET device. In addition, it was confirmed using a scanning electron microscope (SEM) that the hafnium silicide had a grain boundary penetrating the layer in the film thickness direction. The work function thereof was 4.3 eV, which is suitable for n-channel MIS transistors.

Although hafnium silicide in this embodiment is mainly composed of $HfSi_2$, it should not necessarily be $HfSi_2$ considering the objective of the present invention to obtain a work function suitable for n-channel MIS transistors. However, for the reasons mentioned below, it is preferable that the main constituent of the gate electrode of this embodiment is $HfSi_2$. First, $HfSi_2$ is a most stable hafnium silicide in a thermodynamic sense. Accordingly, considering the resistance property in the LSI manufacturing process performed after the formation of the silicide, $HfSi_2$ is the most preferable constituent. Second, the gate electrode in this embodiment requires a grain boundary penetrating the gate electrode to serve as a diffusion path of oxygen atoms. A grain of $HfSi_2$, which is thermodynamically stable, is easily grown, and as a result a single grain tends to be grown in a film thickness direction. Accordingly, $HfSi_2$ is optimum in this embodiment. For similar reasons, if a metal material other than hafnium is used, it is most desirable that a silicide thereof have most stable composition in a thermodynamic sense. For example, orthorhombic $TiSi_2$, orthorhombic $ZrSi_2$, hexagonal $TaSi_2$, hexagonal $NbSi_2$, hexagonal $VSi_2$, hexagonal $Er_3Si_5$, and so on can be used.

Generally, in a solid phase reaction between a metal and a silicide, the chemical reaction proceeds with a plurality of silicide phases being mixed. Accordingly, it is possible that the most stable single silicides phase cannot be formed in this embodiment. Therefore, conditions such as the thickness of the hafnium film, the thickness of the silicon film, and the temperature during the process should be set so that the ratio of the most stable silicide phase to the entire layer should be at least 50%, with which the thermal stability and the formation of the oxygen diffusion path can be effectively secured. From the viewpoint of thermal stability, when the ratio is 50% or less, the movement of atoms between a quasi-stable silicide phase and the most stable silicide phase becomes remarkable and the degradation in morphology of the gate electrode becomes remarkable. From the viewpoint of the formation of the oxygen diffusion path, when the ratio of the most stable silicide phase is less than 50%, a plurality of crystal grains (the most stable and a quasi-stable silicide phases) are formed in the film thickness direction, thereby considerably degrading the continuity of the grain boundary.

Figure 20:
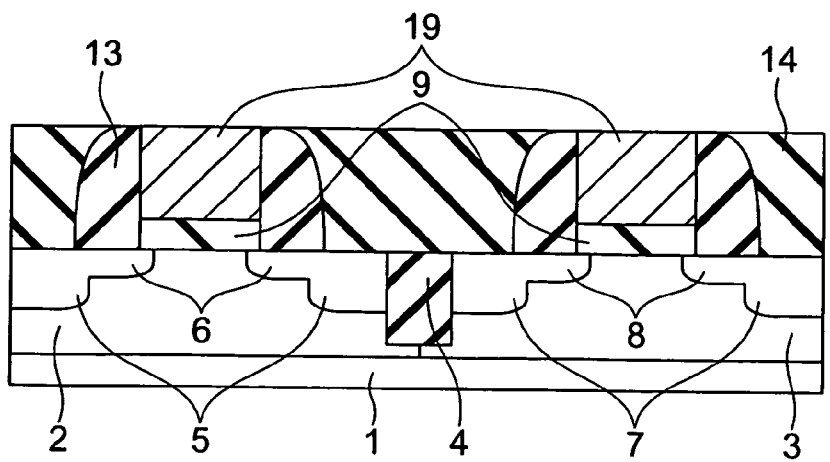
FIG. 20 is a sectional view showing a step of the process of manufacturing the semiconductor device according to the second embodiment.

When an n-type impurity such as phosphorous was added to the silicon gate 17 of the n-channel MIS transistor in advance, the impurity was segregated to the interface between the hafnium silicide and the gate insulating film, thereby decreasing the effective work function by 0.25 eV to become 4.05 eV. This work function is substantially the same as that of an $n^+$ silicon gate, which is suitable to be used in a conventional bulk-type CMOS device, or a high-performance transistor which requires a low threshold voltage. Subsequently, unreacted hafnium is removed using a mixed solution containing sulfuric acid and hydrogen peroxide, thereby obtaining the structure in which two transistors have completely equivalent gate electrodes 20 of hafnium silicide as shown in FIG. 20.

Figure 21:
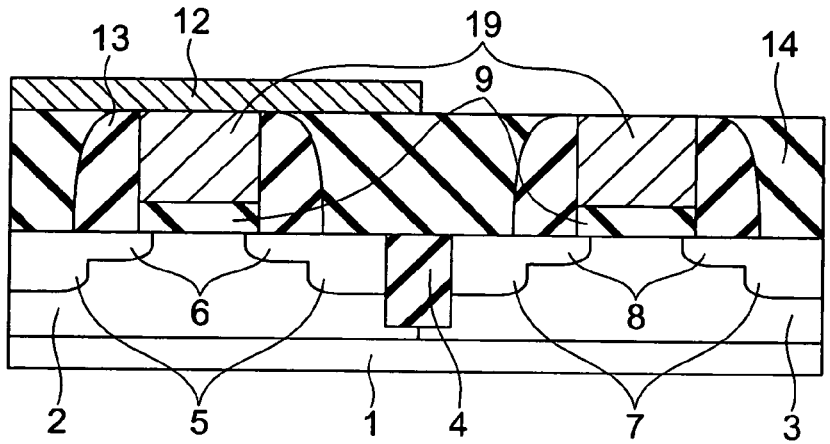
FIG. 21 is a sectional view showing a step of the process of manufacturing the semiconductor device according to the second embodiment.

Next, as shown in FIG. 21, an oxygen dissociative absorption metal layer 12, a Pt layer 12 in this embodiment, is formed only on the p-channel MIS transistor. The formation of the Pt layer 12 is performed by a lift-off method, i.e., by first forming a resist pattern having an opening only in the region of the p-channel MIS transistor, then depositing Pt to have a film thickness of 30 nm by sputtering, and then removing the resist to have the structure shown in FIG. 21.

Subsequently, atomic oxygen is introduced only into the metal silicide 19 of the p-channel MIS transistor 50A by performing thermal processing in an atmosphere containing oxygen. As mentioned in the descriptions of the first embodiment, the atomic oxygen introduced forms dipoles at the interface with the gate insulating film, thereby increasing the effective work function of the metal silicide to have the work function suitable for p-channel MIS transistors. After the aforementioned process, the CMOS device shown in FIG. 16 is completed.

The oxygen dissociative absorption metal layer 12 (the Pt layer 12 in this embodiment) formed on the p-channel MIS transistor 50A shown in FIG. 16 is seldom oxidized during the oxygen treatment in this embodiment, and maintains a low specific resistance. Accordingly, if this layer remains, no problem is caused to the electric contact with the device layer formed above. If this layer causes a problem from the viewpoint of the flattening process, this layer can be removed by, for example, aqua regia treatment, with the gate electrodes 10 and 11 being left.

As described above, according to this embodiment, it is possible to obtain a CMOS device including a gate electrode for which the variation in threshold voltage is little. Furthermore, it is possible to obtain a CMOS device including a gate electrode having a low resistance and heat-resistant properties, and for which there is no problem of depletion and diffusion or penetration of impurity. Moreover, it is possible to prevent an increase in the number of steps for manufacturing such a CMOS device, and to omit complicated processes.

Third Embodiment

Figure 22:
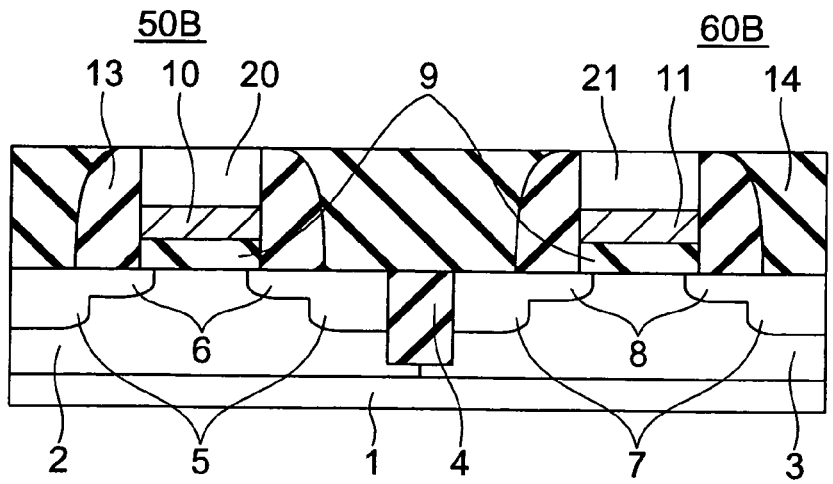
FIG. 22 is a sectional view of a CMOS device according to a third embodiment of the present invention.

Next, a CMOS device according to a third embodiment of the present invention will be described with reference to FIGS. 22 to 25. FIG. 22 shows a sectional view of the CMOS device of this embodiment.

An n-type well region 2 and a p-type well region 3 are provided in a semiconductor substrate 1. The n-type well region 2 and the p-type well region 3 are isolated by an element isolation layer 4 having an STI (Shallow Trench Isolation) structure.

A p-channel MIS transistor 50B is provided in the n-type well region 2, and an n-channel MIS transistor 60B is provided in the p-type well region 3.

The p-channel MIS transistor 50B includes a gate insulating film 9, a first gate electrode 10 formed on the gate insulating film 9, a p$^+$ silicon layer 20 formed on the first gate electrode 10, a p-type extension layer 6 formed in the n-type well region 2 at both sides of the first gate electrode 10, a sidewall layer 13 of an insulating material formed at side portions of the first gate electrode 10 and the p$^+$ silicon layer 20, and a p-type deep source/drain region 5 formed in the n-type well region 2 at both sides of the sidewall layer 13. The junction depth of the p-type deep source/drain region 5 with respect to the n-type well region 2 is adjusted to be deeper than that of the p-type extension layer 6. The p-type deep source/drain region 5 and the p-type extension layer 6 are to serve as source and drain regions of the p-channel MIS transistor 50B.

The n-channel MIS transistor 60B includes a gate insulating film 9, a second gate electrode 11 formed on the gate insulating film 9, an n$^+$ silicon layer 21 formed on the second gate electrode 11, an n-type extension layer 8 formed in the p-type well region 3 at both sides of the second gate electrode 11, a sidewall layer 13 formed at side portions of the second gate electrode 11 and the n$^+$ silicon layer 21, and an n-type deep source/drain region 7 formed in the p-type well region 3 at both sides of the sidewall layer 13. The junction depth of the n-type deep source/drain region 7 with respect to the p-type well region 3 is adjusted to be deeper than that of the n-type extension layer 8. The n-type deep source/drain region 7 and the n-type extension layer 8 are to serve as the source and drain regions of the n-channel MIS transistor 60B.

The material to form the first gate electrode 10 of the p-channel MIS transistor 50B and the second gate electrode 11 of the n-channel MIS transistor 60B has a work function suitable for n-channel MIS transistors and is selected from metal nitride silicides containing Ta, Nb, V, Ti, Zr, Hf, or a rare earth element such as La. The work functions of these materials are in the range of about 4.0 eV to 4.4 eV, and are suitable for setting the threshold voltage of n-channel MIS transistors. Furthermore, these silicides are unlikely to react with the gate insulating film during a deep source/drain region forming process, typically under the condition of a temperature of 1,000° C. or more, and are resistant to the transistor forming process according to a conventional self-alignment process. Accordingly, it is possible to obtain the effects of the present invention if the p$^+$ silicon layer 20 and the n$^+$ silicon layer 21 are omitted in the structure shown in FIG. 22. However, these metal nitride silicides are inferior to conventional silicon gates with respect to the oxidation resistance and the chemical resistance.

When a structure is employed in which a silicon gate is provided on a nitride silicide as shown in FIG. 22, the oxidation resistance and the chemical resistance of the silicon gate are achieved, and a conventional self-alignment process can be applied. At the same time, an effect of restraining depletion and impurity penetration can be obtained due to the existence of the metal nitride silicide.

As in the case of the first embodiment, in the semiconductor device of this embodiment, the oxygen concentration of the first gate electrode in a region at least 1 nm from the interface with the gate insulating film in the film thickness direction is $10^{20}$ cm$^{-3}$ or more and $10^{22}$ cm$^{-3}$ or less.

Figure 23:
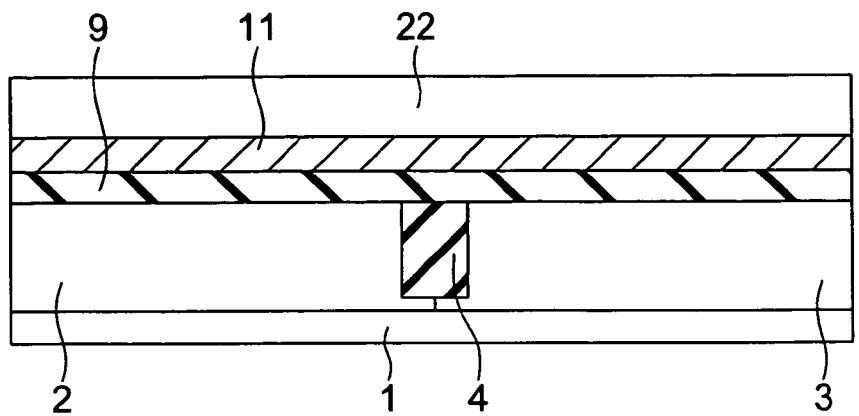
FIG. 23 is a sectional view showing a step of the process of manufacturing the semiconductor device according to the third embodiment.
Figure 24:
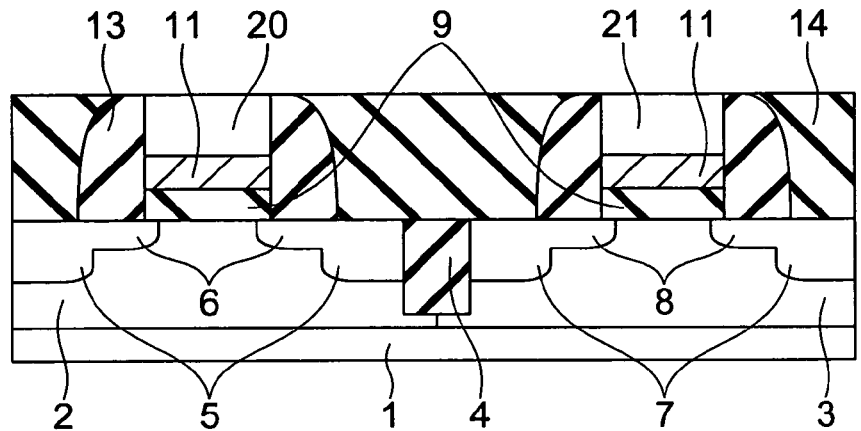
FIG. 24 is a sectional view showing a step of the process of manufacturing the semiconductor device according to the third embodiment.
Figure 25:
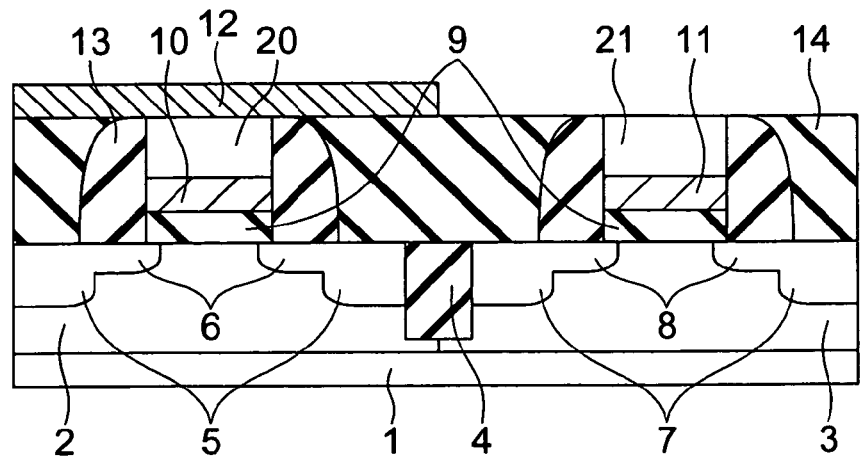
FIG. 25 is a sectional view showing a step of the process of manufacturing the semiconductor device according to the third embodiment.

Next, a method of manufacturing a CMOS device according to the third embodiment will be described below with reference to FIGS. 23 to 25. In this manufacturing method, a hafnium nitride silicide is used to form the first and second gate electrodes.

First, an STI structure 4, an n-type well region 2, and a p-type well region 3 are formed by a normal process. Thereafter, a gate insulating film 9 is formed by a known process. In order to form the gate insulating film 9, SiON having a thickness equivalent to 1.0 nm of SiO$_2$ is deposited in this embodiment. Subsequently, 10 nm of a metal nitride silicide layer 11, a HfSiN layer 11 in this embodiment, is deposited by a CVD method, and a non-doped silicon layer 22 is deposited on the entire surface by a normal CVD method, thereby obtaining the structure shown in FIG. 23. It is desirable that the nitrogen concentration in HfSiN be 5 at. % or more so that no chemical reaction is caused to the HfSiN/silicon gate during the impurity activation step performed later.

Next, the non-doped silicon layer 22 and the metal nitride silicide layer 11 are patterned to have a gate shape. Since the gate layers of the two transistors are formed with completely the same materials, it is possible to process the gates of the p-channel MIS transistor and the n-channel MIS transistor at the same time. Specifically, after a resist pattern is formed on the structure shown in FIG. 23, the non-doped silicon layer 22 is patterned using a normal Si etching method. The etching of the metal nitride silicide layer 11 formed of HfSiN can be easily performed using a chlorine gas. Subsequently, extension layers 6 and 8, a sidewall layer 13, and deep source/drain regions 5 and 7 are formed by a normal self-alignment process. At the time of the formation of the extension layer 6 and the deep source/drain region 5, a p-type impurity is added to the non-doped silicon layer 22 patterned to be suitable for p-channel MIS transistors to make the non-doped silicon layer 22 become a p$^+$ silicon layer 20. At the time of the formation of the extension layer 8 and the deep source/drain region 7, an n-type impurity is added to the non-doped silicon layer 22 patterned to be suitable for n-channel MIS transistors to make the non-doped silicon layer 22 become an n$^+$ silicon layer 21 (see FIG. 24). Thereafter, an interlayer insulating film 14 is formed to obtain the structure shown in FIG. 24.

Figure 26:
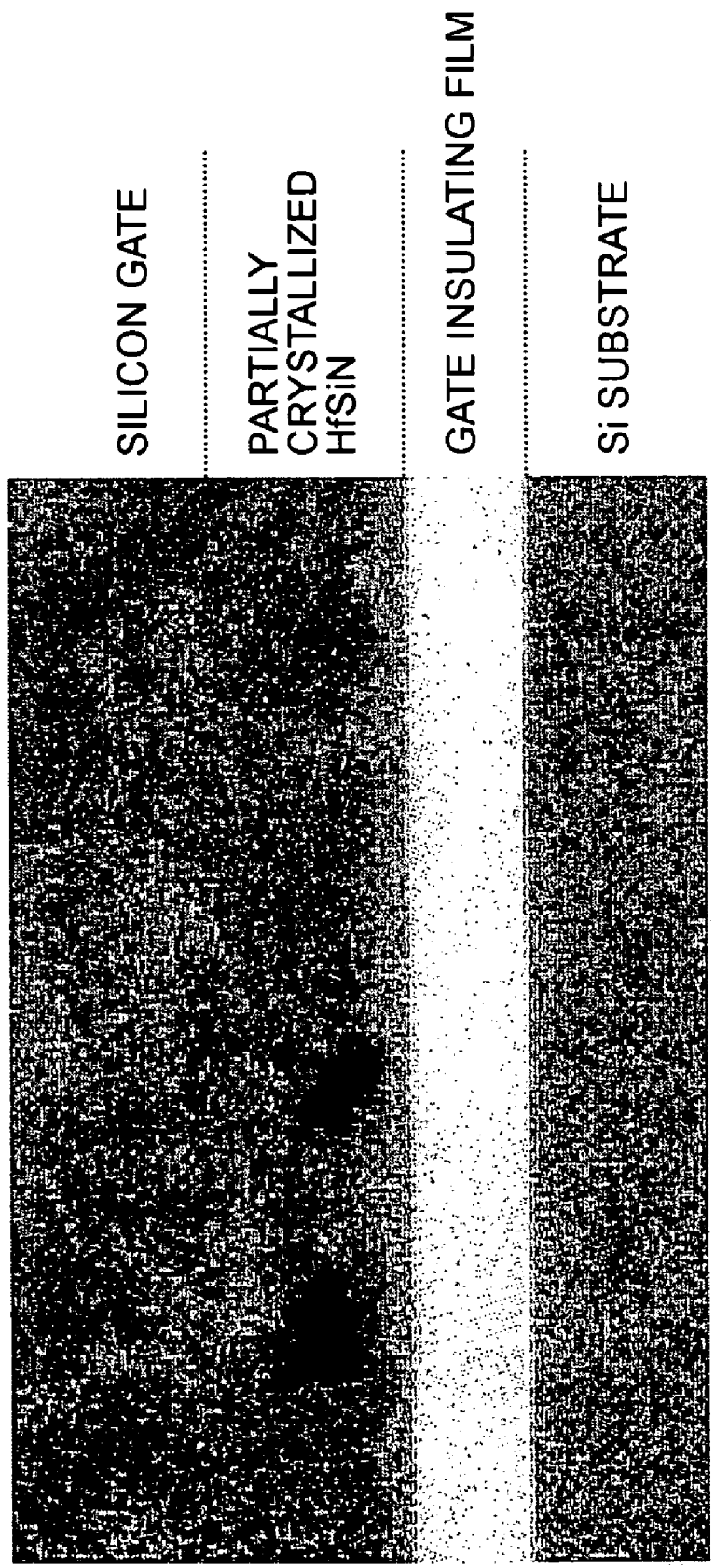
FIG. 26 is a photograph of the gate electrode, which is partially crystallized, of the semiconductor device according to the third embodiment, viewed using a transmission electron microscope.

Next, an oxygen dissociative absorption metal layer 12 of, e.g., W, is formed on the p$^+$ silicon layer 20 of the p-channel MIS transistor by a normal lithography technique. Subsequently, thermal processing is performed on the workpiece in an atmosphere containing oxygen, thereby forming a first gate electrode 10, to which atomic oxygen is added, in a region of the gate electrode 11 of the p-channel MIS transistor contacting the gate insulating film 9 (see FIG. 25). The silicon gate 20 is crystallized and has a grain boundary penetrating therethrough in the film thickness direction. The HfSiN layer 11 has a structure in which Hf silicide is partially crystallized due to the addition of N, and has grain boundaries in a mesh form penetrating therethrough in the film thickness direction. The atomic oxygen dissociated at the oxygen dissociative absorption metal layer 12 is diffused through the grain boundaries of the silicon gate 20 and the HfSiN layer 11 at a high speed. FIG. 26 shows the result of the cross-section TEM observation performed on the multilayer structure of the silicon gate/partially crystallized HfSiN/gate insulating film in the completed MOSFET device. The black-contrast granular portion in the partially crystallized HfSiN is an $HfSi_2$ crystal. A grain boundary vertically penetrating the HfSiN layer having a thickness of about 10 nm serves as a diffusion path for the oxygen atoms. It is preferable that the nitrogen concentration in the HfSiN film is 30 at. % or less in order to obtain the partially crystallized state shown in this drawing.

When hafnium nitride silicide is selected to form the gate electrode material of this embodiment, it is preferable that orthorhombic $HfSi_2$ serves as the main constituent thereof. The first reason is that $HfSi_2$ is the most stable hafnium silicide in a thermodynamic sense, so that $HfSi_2$ is the most desirable material from the viewpoint of the resistance against the LSI manufacturing process performed after the silicide is formed. The second reason is that a grain boundary penetrating the gate electrode, which serves as the diffusion path of oxygen atoms, is required in this embodiment. A grain of $HfSi_2$, which is thermodynamically stable, is easy to grow, and as a result it is easy to have a single grain thereof in the film thickness direction. Thus, $HfSi_2$ is an optimum material in this embodiment.

For similar reasons, in a case where a metal nitride silicide other than hafnium nitride silicide is selected as the gate electrode material of this embodiment, it is desirable that the material contains a partially crystallized silicide having a composition most stable in a thermodynamic sense. For example, orthorhombic $TiSi_2$, orthorhombic $ZrSi_2$, hexagonal TaSi2, hexagonal NbSi2, hexagonal VSi2, hexagonal Er3Si5 and so on can be selected.

It is preferable that the ratio of the most stable silicide phase, in which the thermal stability and the formation of the oxygen diffusion path are effectively secured, to the partially crystallized silicide be at least 50%. From the viewpoint of the thermal stability, when this ratio is 50% or less, the movement of atoms between the quasi-stable silicide phase and the most stable silicide phase becomes remarkable, so that the degradation of morphology of the gate electrode becomes remarkable. From the viewpoint of the formation of oxygen diffusion path, when the ratio of the most stable silicide phase becomes less than 50%, a plurality of crystal grains (the most stable and quasi-stable silicide phases) appear in the film thickness direction, thereby considerably degrading the continuity of grain boundary.

In this embodiment, W (tungsten) is used to form the oxygen dissociative absorption layer 12. However, it is possible that silicidation reaction is caused between W and the p$^+$ silicon layer 20. When all of W becomes a silicide, the effect of dissociating oxygen molecules to efficiently deliver oxygen to the portion of the gate electrode contacting the gate insulating film is degraded. Accordingly, in this embodiment, it is desirable that the thermal processing be performed at a temperature of 600° C. or less, at which temperature the silicidation reaction of W does not proceed at an extremely high speed.

Thereafter, the oxygen dissociative absorption metal layer 12 of W is removed by, e.g., wet etching using HF aqueous solution etc., thereby obtaining the structure shown in FIG. 22.

As describe above, according to this embodiment, it is possible to obtain a CMOS device including a gate electrode having a low resistance and a heat-resistant property, and causing no problem of depletion and diffusion or penetration of an impurity. Furthermore, it is possible to prevent an increase in the number of steps for manufacturing the COMS device. In addition, complicated processes can be omitted.

As described above, according to the embodiments of the present invention, it is possible to obtain a CMOS device including a gate electrode, in which the variation in threshold voltage is not so great. Furthermore, it is possible to obtain a CMOS device having a gate electrode having a low resistance and a heat resistant property, which does not cause a problem of depletion and diffusion or penetration of an impurity. Moreover, it is possible to obtain a manufacturing method in which there is no increase in the number of steps, and no complicated steps.

In the above descriptions, the work functions of the aforementioned gate electrodes are those for an n-channel MOSFET and a p-channel MOSFET of a typical CMOS device. However, in a CMOS device for a special application or in a specific generation, the work functions required for the gate electrodes of an n-channel MOSFET and a p-channel MOSFET may be opposite to those in conventional MOSFETs. It is possible that the work function of a gate electrode of a typical p-channel MOSFET is required for a gate electrode of a special-purpose n-channel MOSFET, and the work function of a gate electrode of a typical n-channel MOSFET is required for a gate electrode of a special-purpose p-channel MOFET.

An example of such a work function for a special application or in a specific generation is a work function required for a gate electrode of an LSTP (Low Standby Power) device of complete depletion type SOI devices in a generation after the 45 nm technology generation. Unlike the aforementioned cases, in such a case, a work function of 4.7 eV-5.1 eV is required for a gate electrode of an n-channel MOSFET, and a work function of 4.2 eV-4.4 eV is required for a gate electrode of a p-channel MOSFET. The present invention should be applied to such a device for a special application or in a specific generation so as to meet the required conditions.

As described above, according to the embodiments of the present invention, it is possible to provide a CMOS device including a gate electrode in which the variation in threshold value is little, and a method of manufacturing the same.

The present invention is not limited to the aforementioned embodiments, and the constituent elements thereof can be modified without departing from the spirit and scope thereof. Furthermore, it is possible to make various inventions by appropriately combining a plurality of constituent elements disclosed in the aforementioned embodiments. For example, some constituent elements can be removed from the constituent elements disclosed in the aforementioned embodiments, and some constituent elements selected from different embodiments can be appropriately combined.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concepts as defined by the appended claims and their equivalents.

The invention claimed is:

1. A semiconductor device comprising:
    a first MIS transistor with a first conductivity type channel, including a first semiconductor region of a second conductivity type formed in a semiconductor substrate, a first gate insulating film formed on the first semiconductor region, a first gate electrode formed on the first gate insulating film, the first gate electrode being formed of a material for which a work function shows a value suitable for second conductivity type MIS transistors, and first source and drain regions formed in the first semiconductor region at both sides of the first gate electrode; and a second MIS transistor with a second conductivity type channel, including a second semiconductor region of the first conductivity type formed in the semiconductor substrate, a second gate insulating film formed on the second semiconductor region, a second gate electrode formed on the second gate insulating film, the second gate electrode being formed of a material for which a work function shows a value suitable for second conductivity type MIS transistors, and second source and drain regions formed in the second semiconductor region at both sides of the second gate electrode, wherein in a region in the first gate electrode 1 nm or less apart from an interface with the first gate insulating film in a film thickness direction, a concentration of oxygen is $1 \times 10^{20}$ cm$^{-3}$ or more and $1 \times 10^{22}$ cm$^{-3}$ or less, and only the oxygen is capable of causing work function modulation of the first gate electrode.

2. The semiconductor device according to claim 1, wherein the first gate electrode includes at least one grain boundary penetrating the first gate electrode in a film thickness direction.

3. The semiconductor device according to claim 1, wherein the first and second gate electrodes are formed of a material selected from the group consisting of a metal selected from Ta, Nb, and V, a silicide of a material selected from Ta, Nb, V, Ti, Zr, Hf, and a rare earth element, and a boride of a rare earth element.

4. The semiconductor device according to claim 1, wherein a conductive film is provided on the first and second gate electrodes, the conductive film being formed of a material selected from the group consisting of W, Pt, Pd, and Rh.

5. The semiconductor device according to claim 1, wherein the first and second gate electrodes are formed of a material selected from a group consisting of a metal nitride silicide containing any of Ta, Nb, V, Ti, Zr, Hf, and a rare earth element.

6. The semiconductor device according to claim 5, wherein a silicon layer of the first conductivity type is formed on the first gate electrode, and a silicon layer of the second conductivity type is formed on the second gate electrode.

7. The semiconductor device according to claim 1, wherein a physical thickness of the first and second gate electrodes is 2 nm or more and 100 nm or less.

8. The semiconductor device according to claim 1, wherein the first and second gate insulating films are formed of a high-k material.

9. The semiconductor device according to claim 1, wherein an average electronegativity of cation atoms in at least a region of the first gate insulating film contacting the first gate electrode is higher than an electronegativity of cation atoms in the first gate electrode.

10. The semiconductor device according to claim 1, wherein the semiconductor substrate is an SOI substrate.

11. The semiconductor device according to claim 1, wherein the first conductivity type is p-type and the second conductivity type is n-type.

12. The semiconductor device according to claim 1, wherein the first and second gate insulating films are formed of HfSiON.

13. The semiconductor device according to claim 1, wherein the first and second gate electrodes are formed of a material selected from the group consisting of HfSi$_2$, TiSi$_2$, ZrSi$_2$, TaSi$_2$, NbSi$_2$, VSi$_2$, and Er$_3$Si$_5$.

14. The semiconductor device according to claim 1, wherein the first and second gate electrode have a crystalline structure of a material selected from the group consisting of orthorhombic HfSi$_2$, orthorhombic TiSi$_2$, orthorhombic ZrSi$_2$, hexagonal TaSi$_2$, hexagonal NbSi$_2$, hexagonal VSi$_2$, hexagonal Er$_3$Si$_5$.

15. The semiconductor device according to claim 1, wherein a specific resistance of the first gate electrode is higher than that of the second gate electrode.

* * * * *